(12) United States Patent
St Germain et al.

(10) Patent No.: US 9,973,833 B2
(45) Date of Patent: May 15, 2018

(54) PARAMETER CORRECTION FOR CASCADED SIGNAL COMPONENTS

(71) Applicant: Analog Devices, Inc., Norwood, MA (US)

(72) Inventors: Michael C. St Germain, Boston, MA (US); Kimo Tam, Lincoln, MA (US); Mohammad Hassan Ghaed, Brighton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days. days.

(21) Appl. No.: 15/277,739

(22) Filed: Sep. 27, 2016

(65) Prior Publication Data

US 2018/0090222 A1 Mar. 29, 2018

(51) Int. Cl.

| | |
|---|---|
| *H04Q 9/00* | (2006.01) |
| *G11C 29/02* | (2006.01) |
| *H03M 1/06* | (2006.01) |
| *H03M 1/66* | (2006.01) |
| *H03M 1/10* | (2006.01) |
| *G11C 7/22* | (2006.01) |

(Continued)

(52) U.S. Cl.
CPC ............ *H04Q 9/00* (2013.01); *G11C 7/062* (2013.01); *G11C 7/10* (2013.01); *G11C 7/22* (2013.01); *G11C 8/10* (2013.01); *G11C 29/023* (2013.01); *H03M 1/0617* (2013.01); *H03M 1/1009* (2013.01); *H03M 1/66* (2013.01); *H04N 21/60* (2013.01)

(58) Field of Classification Search
CPC ........... G11C 29/023; G11C 8/10; G11C 7/10; G11C 7/22; G11C 7/062; H03M 1/66; H03M 1/1009; H03M 1/0617
See application file for complete search history.

(56) References Cited

U.S. PATENT DOCUMENTS 4,818,988 A * 4/1989 Cooperman ........... H04Q 3/521
  327/404
5,166,926 A * 11/1992 Cisneros ............. H04L 12/5601
  370/392

(Continued)

FOREIGN PATENT DOCUMENTS

| CN | 1567910 A | 1/2005 |
|---|---|---|
| EP | 0978968 B1 | 2/2005 |

OTHER PUBLICATIONS

Tretter, Kevin L., "Analog Input Buffer Architectures", AN241REV1, © 2003 Cirrus Logic, Inc., (2003), 1-16.

*Primary Examiner* — Ajay Ojha
(74) *Attorney, Agent, or Firm* — Schwegman Lundberg & Woessner, P.A.

(57) ABSTRACT

Various examples are directed to crosspoint switches and methods of use thereof. An example cross point switch comprises a first row buffer, a second row buffer, a first column buffer, and a second column buffer. The crosspoint switch may also comprise a first switch that, when closed, electrically couples the second row buffer to the first column buffer, and a correction controller. The correction controller may be configured to send a first correction signal to the first row buffer; send a second correction signal to the second row buffer; receive an indication that the first switch is closed; send a third correction signal to the first column buffer; and send a fourth correction signal to the second column buffer.

21 Claims, 20 Drawing Sheets

(51) Int. Cl.
G11C 7/06 (2006.01)
G11C 8/10 (2006.01)
G11C 7/10 (2006.01)
H04N 21/60 (2011.01)

(56) References Cited

U.S. PATENT DOCUMENTS

| | | |
|---|---|---|
| 5,805,614 A | 9/1998 | Norris |
| 6,738,858 B1 | 5/2004 | Fernald et al. |
| 6,771,162 B1 | 8/2004 | Moss |
| 6,980,055 B2 | 12/2005 | Gharpurey |
| 7,710,153 B1 | 5/2010 | Masleid et al. |
| 7,719,405 B2 | 5/2010 | Mulcahy et al. |
| 8,289,127 B2 | 10/2012 | Bankman et al. |
| 8,705,546 B2 | 4/2014 | Bankman et al. |
| 2008/0175590 A1* | 7/2008 | Perkins .................. H04J 14/02 398/58 |
| 2009/0108925 A1* | 4/2009 | Tang .................... G11C 11/413 327/551 |
| 2010/0156504 A1 | 6/2010 | Masleid et al. |
| 2011/0277010 A1* | 11/2011 | Paul ........................ H04B 3/06 725/149 |
| 2016/0041935 A1* | 2/2016 | Kinjo .................. G06F 13/4022 710/116 |

* cited by examiner

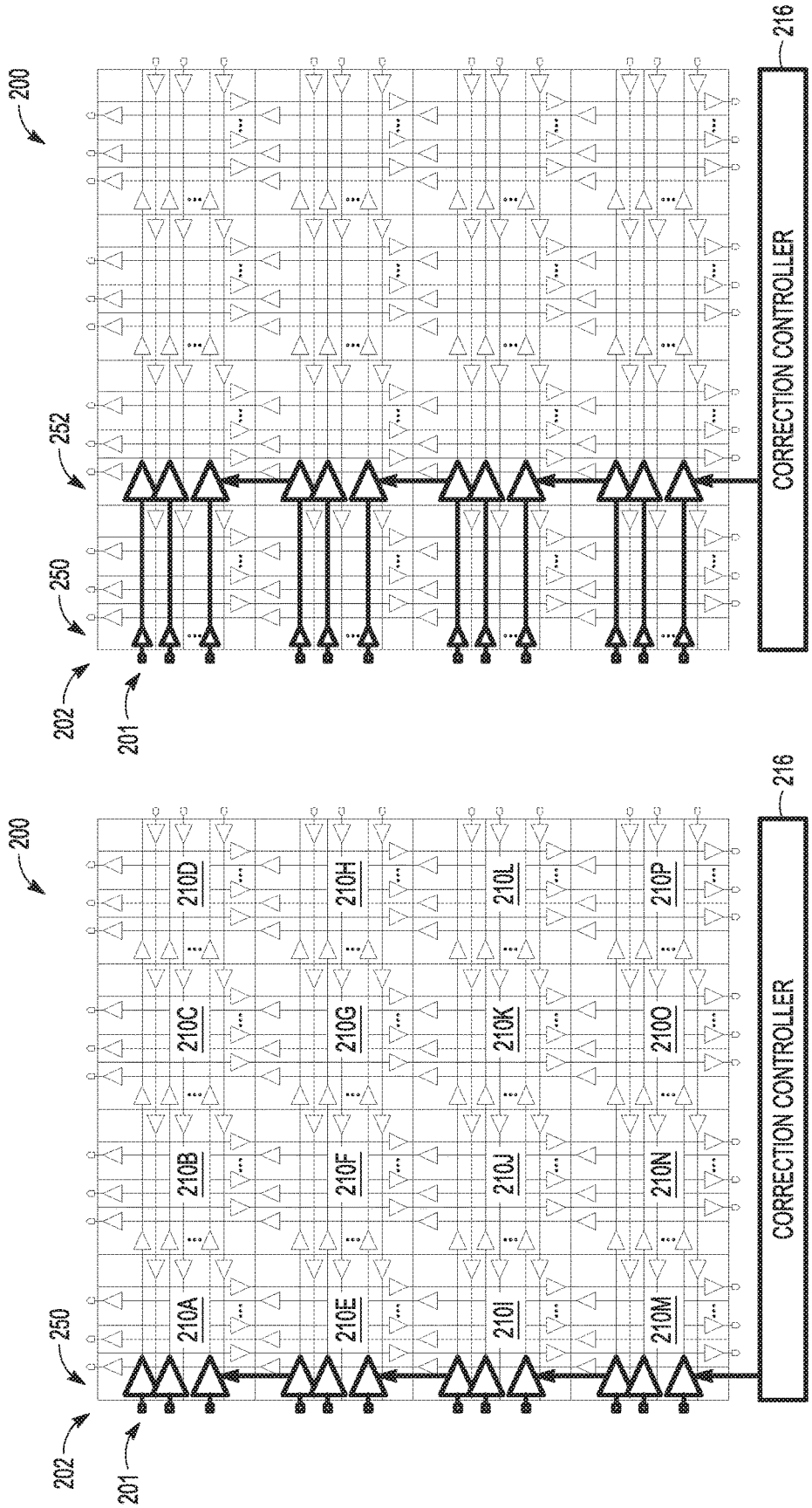

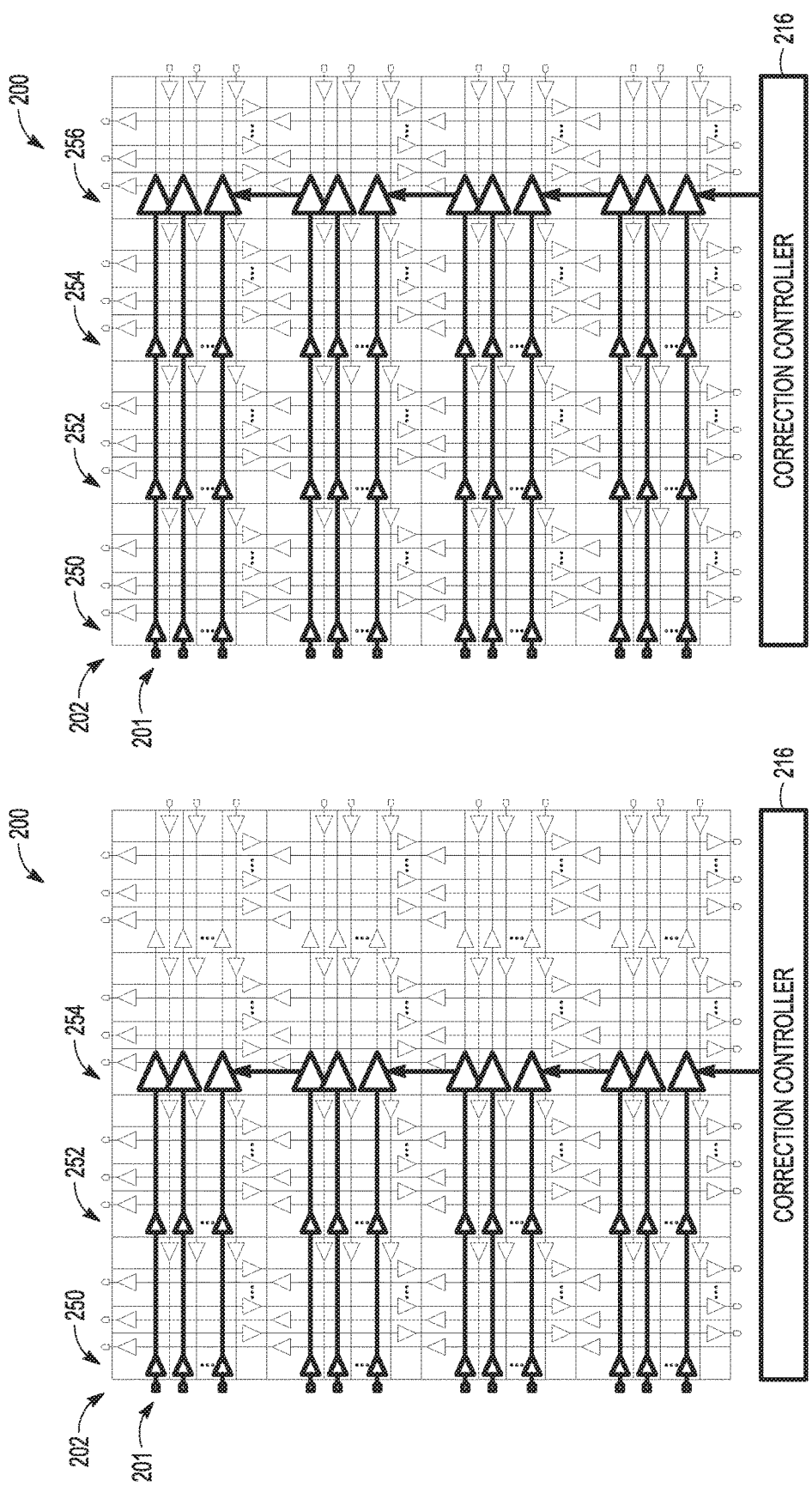

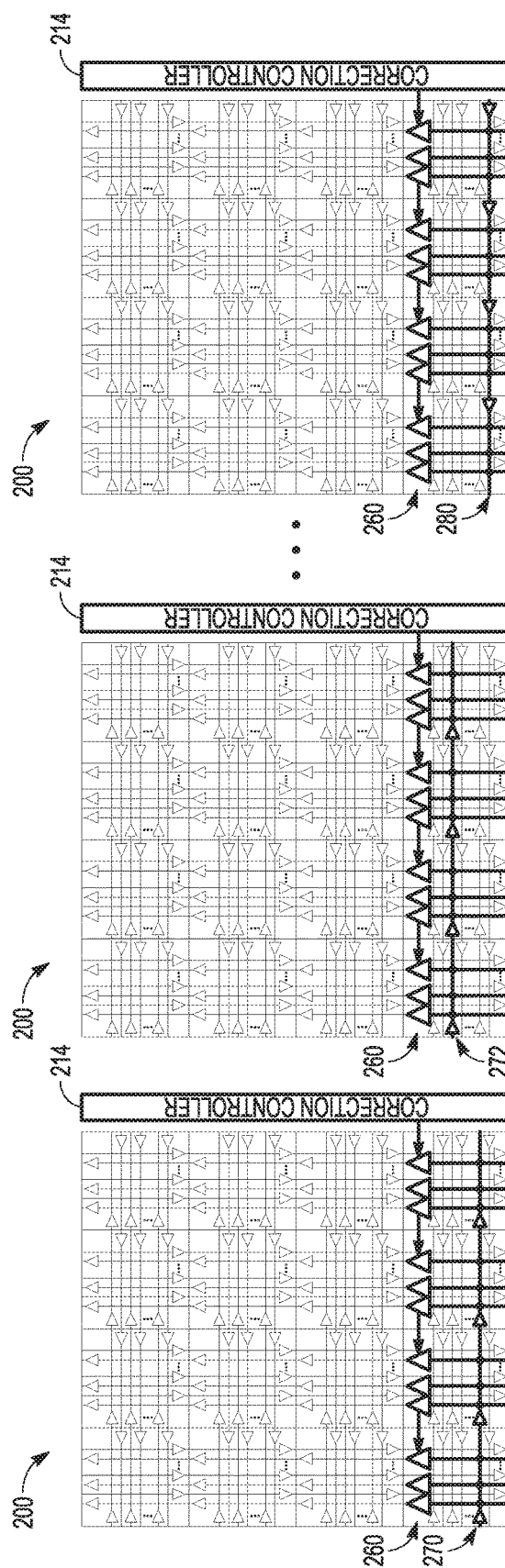

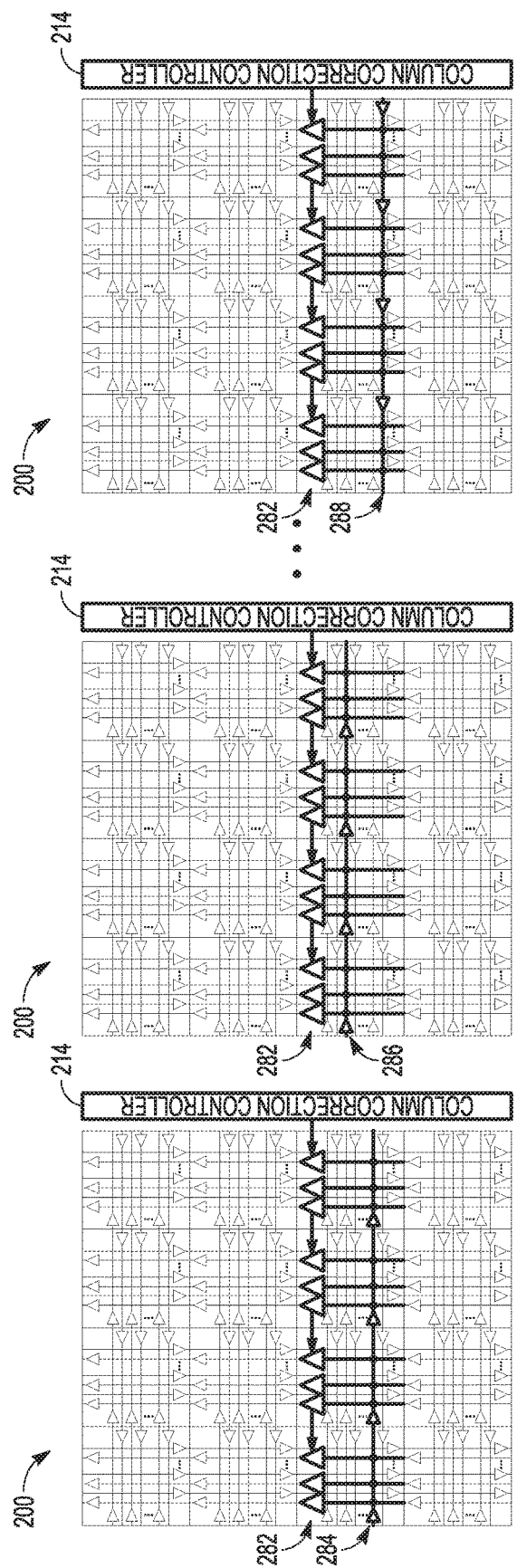

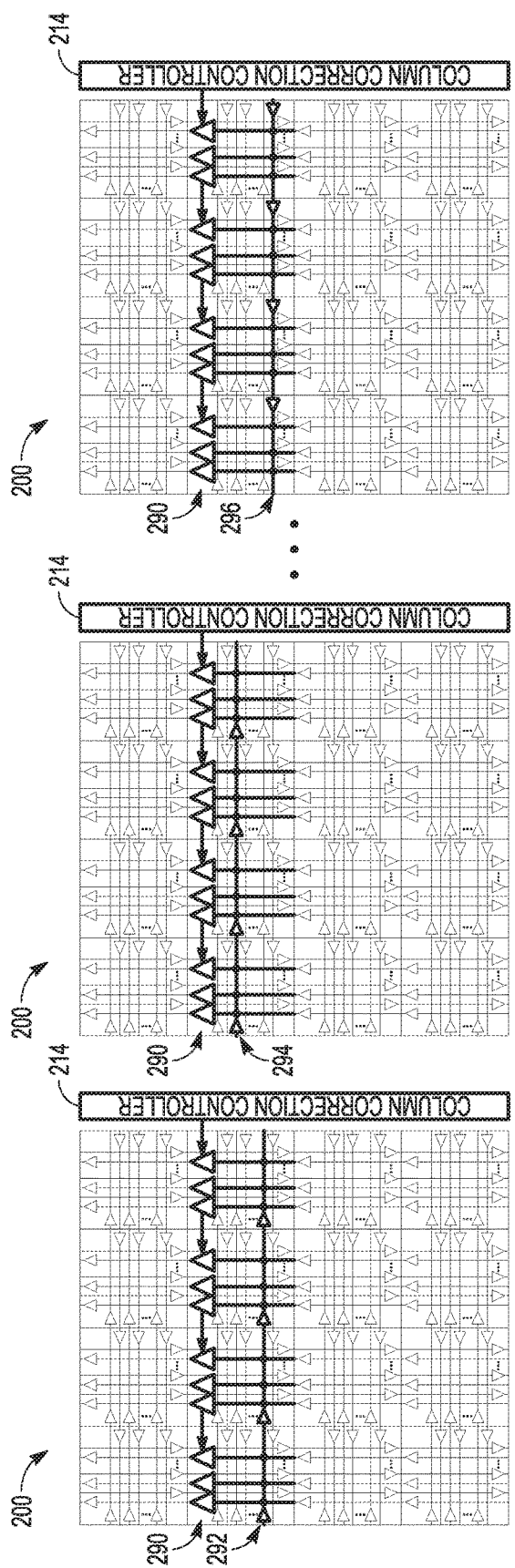

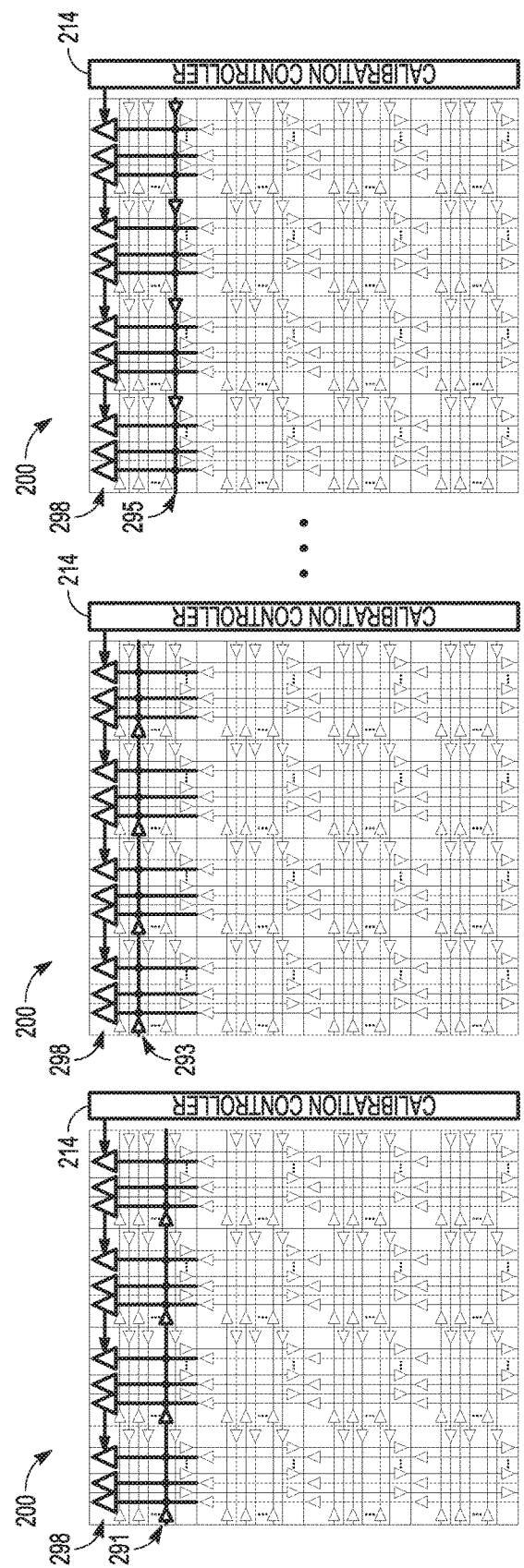

US 9,973,833 B2

1

PARAMETER CORRECTION FOR CASCADED SIGNAL COMPONENTS

FIELD OF THE DISCLOSURE

This document pertains generally, but not by way of limitation, to integrated circuits and, and particularly, but not by way of limitation, to cascaded signal components.

BACKGROUND

Some devices, utilize cascaded signal components. For example, some crosspoint switches utilize cascaded buffers to maintain a signal across a switching fabric. Also, some devices use a set of cascaded amplifiers to amplify a signal. Signal components, such as amplifiers, buffers, etc., often deviate from ideal parameters, such as gain, duty-cycle-distortion (DCD), etc. When signal components are cascaded, parameter degradation from individual components is compounded, which can result in increased signal degradation.

SUMMARY OF THE DISCLOSURE

Various examples are directed to systems and methods for providing correction to cascaded signal components (e.g., buffers, amplifiers, etc.). A correction signal may be applied to multiple signal components in a set of cascaded signal components.

In certain examples, a system is provided that discloses a set of cascaded signal components that may include a first signal component and a second signal component. An output of the first signal component may be electrically coupled to an input of the second signal component. A correction controller may provide a first correction signal to the first signal component and a second correction signal to the second signal component.

In certain examples, the correction controller may also select the correction signals for signal components in the set of cascaded signal components. For example, the correction controller may provide a test signal to the first signal component. The correction controller may provide a plurality of test correction signals to the first signal component and monitor an output of the first signal component. The correction controller may select the first correction signal based, at least in part, on the output of the first signal component.

In certain examples, a crosspoint switch is provided that discloses a plurality of buffers, a first switch, and a correction controller. In some examples, the switch is a point-cell. The plurality of buffers may include a first row buffer, a second row buffer, a first column buffer, and a second column buffer. An output of the first row buffer may be electrically coupled to an input of the second row buffer. An output of the first column buffer may be electrically coupled to an input of the second column buffer. The switch may have an open position and a closed position. In the closed position, the switch may electrically couple an output of the second row buffer to an input of the first column buffer. The correction controller may send correction signals to the first row buffer and the second row buffer. The correction controller may also receive an indication that the first switch is closed and send correction signals to the first column buffer and the second column buffer.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 7-10 are diagrams showing examples of the crosspoint switch that illustrate row positions.

FIGS. 14-16 show examples of the crosspoint switch of FIG. 2 with point-cells along a first row of row buffers closed.

FIGS. 17-19 show examples of the crosspoint switch of FIG. 2 configured to calibrate column buffers at a column buffer position.

FIGS. 20-22 show examples of the crosspoint switch of FIG. 2 configured to calibrate column buffers at a column buffer position.

FIGS. 23-25 show examples of the crosspoint switch of FIG. 2 configured to calibrate column buffers at a column buffer position.

DETAILED DESCRIPTION

When amplifiers, buffers, or other signal components are electrically coupled as a cascade, errors caused by individual signal components are compounded through the cascade. Correcting a signal before or after it is provided to the cascade can address some of the resulting signal degradation, but the effectiveness of pre- or post-cascade correction is reduced as the length of the cascade increases.

In various examples described herein a correction controller applies a correction signal to individual signal components in a cascade. In some examples, correction signals are applied to all signal components in a cascade. A correction signal provided to a signal component may modify a gain, duty cycle distortion (DCD), offset, or other parameter of the signal component. In some examples, correcting signal components individually may enable longer cascades without excessive signal degradation.

In certain examples, a cascade of signal components may include a cascade of buffers in a crosspoint switch. A crosspoint switch is a component that includes multiple inputs and multiple outputs. A switching fabric may include one or more point-cell switches, also referred to as point-cells. Point-cells may be or include switches selectively closable to connect one or more of inputs, such as the inputs to the switching fabric, to one or more outputs, such as the outputs to the switching fabric. Within the switching fabric, buffers may be used to maintain the fidelity of the signal between the selected input and the selected output. The buffers may be arranged in a cascade. One or more correction controllers may determine and provide correction signals, at least to the buffers that are on an active signal path.

Figure 1:
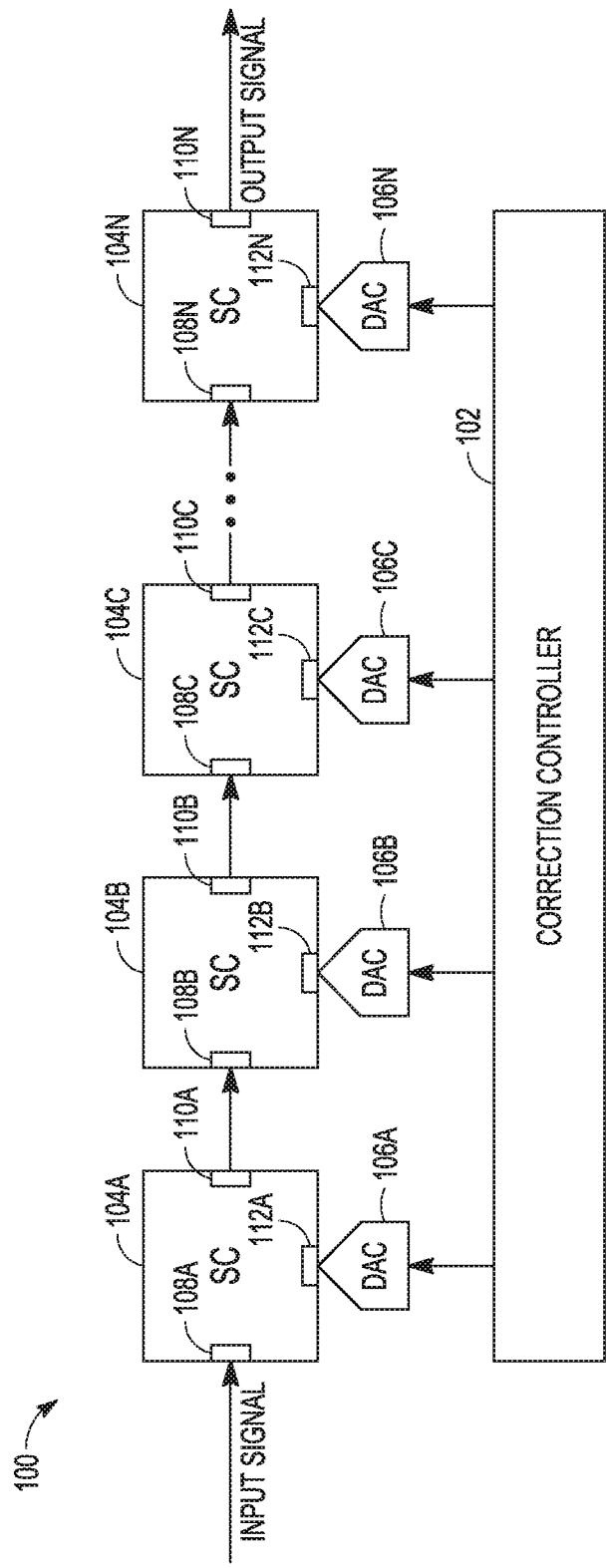
FIG. 1 is a diagram showing one example of a cascade of signal components with parameter correction.

FIG. 1 is a diagram showing one example of a cascade 100 of signal components 104A, 104B, 104C, 104N with parameter correction. The signal components 104A, 104B, 104C, 104N may be any suitable components that act on a signal including, for example, buffers, amplifiers, etc. For example, signal components 104A, 104B, 104C, 104N may provide at their respective signal outputs 110A, 110B, 110C, 110N an output signal that is modified from the signal input signal received at their respective signal inputs 108A, 108B, 108C, 108N.

The signal components 104A, 104B, 104C, 104N may be cascaded in that the output of one signal component may be electrically coupled to the signal input of a next signal component in the cascade 100. For example, a signal input 108A of signal component 104A receives an input signal. A signal output 110A of the signal component 104A may be electrically coupled to a signal input 108B of the signal component 104B. A signal output 110B of the signal component 104B may be electrically coupled to a signal input 108C of the signal component 104C. A signal output 110C of the signal component 104C may be electrically coupled to a signal input of the next signal component in the cascade (not shown). A last signal component 104N may have an input 108N electrically coupled to a signal output of a previous signal component in the cascade (not shown). A signal output 110N of the signal component 104N may provide an output signal that is an output of the cascade 100. Although four signal components 104A, 104B, 104C, 104N are shown in FIG. 1, any suitable number of signal components 104A, 104B, 104C, 104N may be included in the cascade including more or fewer than are shown in FIG. 1.

A correction controller 102 may provide correction signals to the respective signal components 104A, 104B, 104C, 104N (e.g., to respective correction inputs 112A, 112B, 112C, 112N). The correction signals may modify a parameter or parameters of the respective signal components 104A, 104B, 104C, 104N. In an example where the signal components 104A, 104B, 104C, 104N are amplifiers, for example, the correction signals may modify a gain of the respective signal components 104A, 104B, 104C, 104N. In an example where the signal components 104A, 104B, 104C, 104N are differential buffers, the correction signals may trigger additional current to the positive or negative side of the buffer, for example, to reduce duty cycle distortion (DCD) and accompanying inter-symbol interference (ISI). The correction controller 102 may be or include any suitable circuit for generating and/or providing correction signals to the signal components 104A, 104B, 104C, 104N. For example, the correction controller 102 may include one or more processors such as, for example, microcontrollers, digital signal processors (DSPs), etc. In some examples, the correction controller 102 includes one or more logic gates, state machines, or other suitable control circuitry in addition to or instead of a processor. The correction controller 102, in some examples, may also be configured to determine corrections signals for the signal components 104A, 104B, 104C, 104N, for example, as described herein.

In some examples, the correction controller 102 generates correction digital correction signals in a digital format. Optional digital-to-analog converters (DACs) 106A, 106B, 106C, 106N may be electrically coupled to receive digital correction signals for the respective signal components 104A, 104B, 104C, 104N at respective DAC inputs, convert the digital correction signals to analog correction signals, and provide the analog correction signals at respective DAC outputs. DAC outputs may be electrically coupled to the correction inputs 112A, 112B, 112C, 112N of the respective signal components 104A, 104B, 104C, 104N. In some examples, digital correction signals may have a small number of bits (e.g., fewer than 8 bits, such as 4 bits, 3 bits, 2 bits, etc.). In this way, DACs 106A, 106B, 106C, 106N may be smaller (e.g., significantly smaller) and/or use less energy than comparable DACs for handling digital signals with a larger number of bits (e.g., signals with 8 bits or more).

Figure 2:
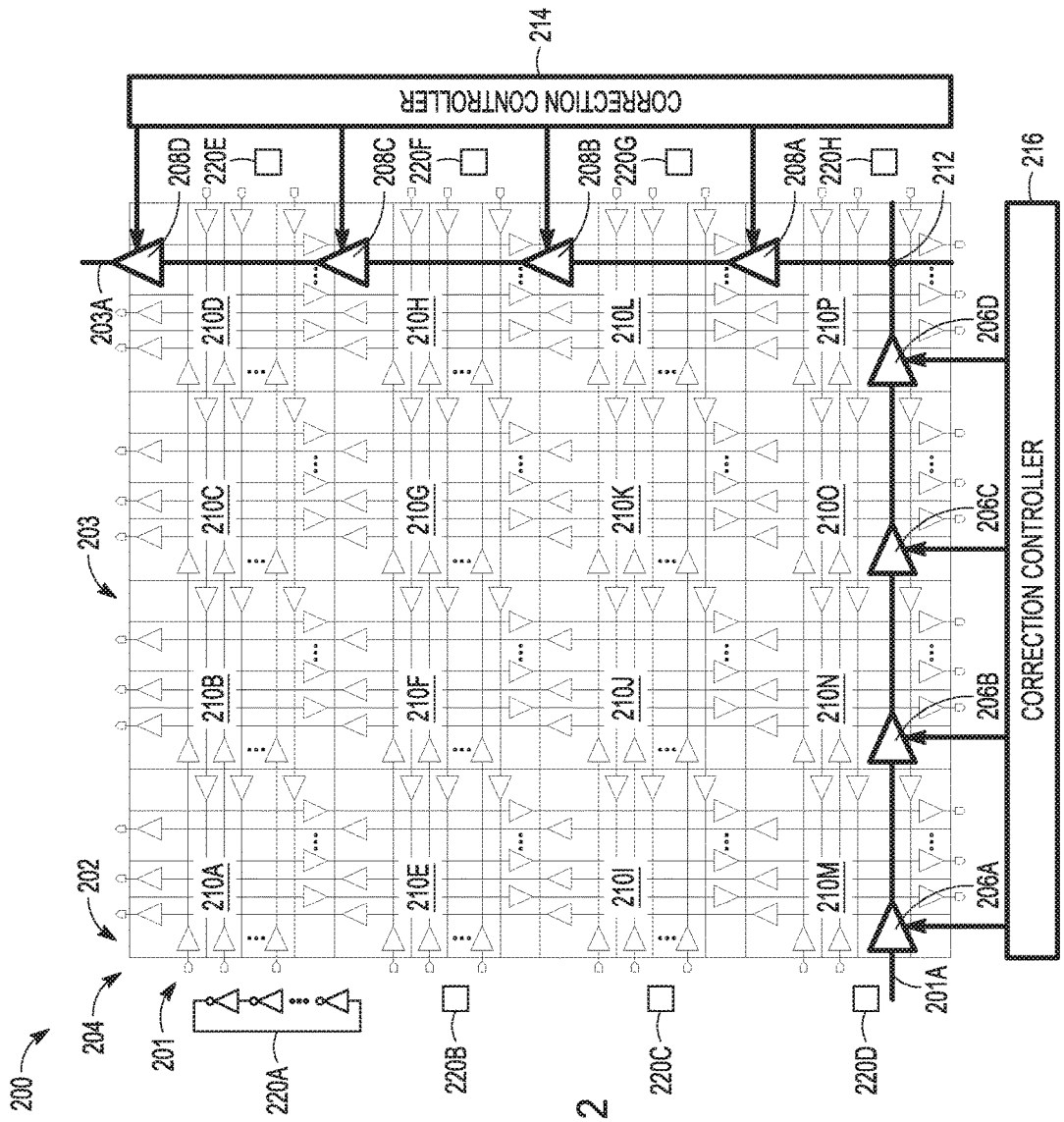
FIG. 2 is a diagram showing one example of a crosspoint switch with parameter correction.

In various examples, parameter correction as described herein may be utilized in a crosspoint switch. FIG. 2 is a diagram showing one example of a crosspoint switch 200 with parameter correction. The crosspoint switch 200 includes a plurality of inputs 201 and a plurality of outputs 203. The crosspoint switch 200 is configurable to connect a selected input 201 to a selected output 203. An input signal received at one of the inputs 201, accordingly, is routed to a selected output 203. In some examples, the input signal may be a digital signal having a value that transitions between a logical zero and a logical one. For example, the input signal may represent logical zero when the voltage is zero. The signal may represent a logical one when the voltage is at a predetermined value (e.g., 3 volts, 5 volts, etc.). This is just one example scheme for representing a logical zero and logical one on an electric signal. Any suitable scheme may be used including, for example, assigning different voltage levels to logical zero and logical one, assigning current values to logical zero and logical one, etc. In another example scheme, a negative voltage may represent a logic zero while a positive voltage may represent logic 1.

In the example of FIG. 2, the crosspoint switch 200 includes sixty-four inputs 201 and sixty-four outputs 203, although any suitable number of inputs and outputs may be present. For example, the crosspoint switch 200 comprises a plurality of row signal paths 202 and a plurality of column signal paths 204. Each row signal path 202 may be electrically coupled to an input 201 and each column signal path 204 may be electrically coupled to an output 203. Point-cells may be positioned at some or all of the intersections between row signal paths 202 and column signal paths 204. A point-cell may be or include a switch that can selectively connect or disconnect a given row signal path 202 with a given column signal path 204. Although the signal paths 202, 204 are described as rows and columns, it will be appreciated that crosspoint switches, such as 200, may be used in different orientations and/or described differently. Accordingly, row or column signal paths 202, 204 may be in any orientation. For example, the crosspoint switch 200 may be rotated from the position shown in FIG. 2 such that row signal paths 202 are vertical or near-vertical and column signal paths 204 are horizontal or near-horizontal.

Row signal paths 202 and column signal paths 204 may include buffers to prevent signal degradation, for example, reduced bandwidth due to parasitic impedance in the signal paths 202, 204 and point-cells. Buffers may be positioned at any suitable interval on the crosspoint switch 200. In some examples, the crosspoint switch 200 may include tiles of smaller switch fabrics. For example, the crosspoint switch 200 includes sixteen tiles 210A-P, each having 16 inputs and 16 outputs. In the example of FIG. 2, a buffer is positioned at the edge of each tile. For convenience, buffers along row signal paths 202 are referred to herein as row buffers and buffers along column signal paths are referred to herein as column buffers. Row buffers and column buffers may be the same or different, for example, as described herein.

FIG. 2 shows an example point-cell 212 in a closed position to connect an example row signal path 202 including row buffers 206A, 206B, 206C, 206D to an example column signal path 204 including column buffers 208A, 208B, 208C, 208D. Accordingly, the input 201A may be connected to the output 203A via a cascade of buffers including row buffers 206A, 206B, 206C, 206D, point-cell 212, and column buffers 208A, 208B, 208C, 208D.

FIG. 2 also shows an example row correction controller 216 and column correction controller 214. The row correction controller 216 may provide correction signals to row buffers 206A, 206B, 206C, 206D. The column correction controller 214 may provide correction signals to column buffers 208A, 208B, 208C, 208D. Correction controller 214, 216 may also be configured to calibrate the various buffers in the crosspoint switch to determine appropriate correction signals for different configurations of the crosspoint switch 200.

Correction controllers 214, 216 may include and/or be in communication with respective test signal generators 220A-H. Test signal generators 220A-H may generate signals that may be provided to the buffers of the crosspoint switch 200, as described herein, to calibrate the buffers. Test signal generators 220A-H may be or include any suitable type of circuitry for generating test signals. In some examples, as illustrated by the test signal generator 220A, one or more of the test signal generators 220A-H may be or include a ring oscillator. A ring oscillator may comprise an odd number of logic NOT gates and may oscillate between a voltage indicating a logical zero and a voltage indicating a logical one. In some example, one or more of the test signal generators 220A-H may be calibrated prior to use. In the example of FIG. 2, the crosspoint switch 200 includes one test signal generator 220A-H per row of tiles and per signal direction. For example, test signal generator 220A may provide test signals to buffers in tiles 210A, 210B, 210C, and 210D that are wired to inputs 201 on the left hand side of the crosspoint switch 200 (as the crosspoint switch 200 is oriented in FIG. 2). Test signal generator 220E may provide test signals to buffers 210A, 210B, 210C, 210D that are wired to inputs 201 on the right hand side of the crosspoint switch 200 (as the crosspoint switch 200 is oriented in FIG. 2). Although separate correction controllers 214, 216 and test signal generators 218, 220 are shown for the row buffers 206A, 206B, 206C, 206D and column buffers 208A, 208B, 208C, 208D, in some examples, a single correction controller may provide correction signals to and/or calibrate both row and column buffers.

In some examples, the correction controller 214, 216 may correct the buffers for duty cycle distortion (DCD). For example, the buffers (206B, 206C, 206D, 208A, 208B, 208C, 208D and other buffers of the crosspoint switch 200) may be differential buffers including matched transistor pairs. (See FIG. 4). If the transistor pairs in a buffer are not sufficiently matched, then the edges between portions of the signal at the buffers representing logical zero and portions of the signal representing logical one may become distorted. Distortions from buffers across a cascade of buffers may compound, generating greater DCD. When DCD becomes too high, it can lead to inter-symbol interference (ISI). When ISI occurs, it may become difficult or impossible to determine the difference between portions of the signal corresponding to logical zero and portions of the signal corresponding to logical one, resulting in possible bit errors.

Figure 3:
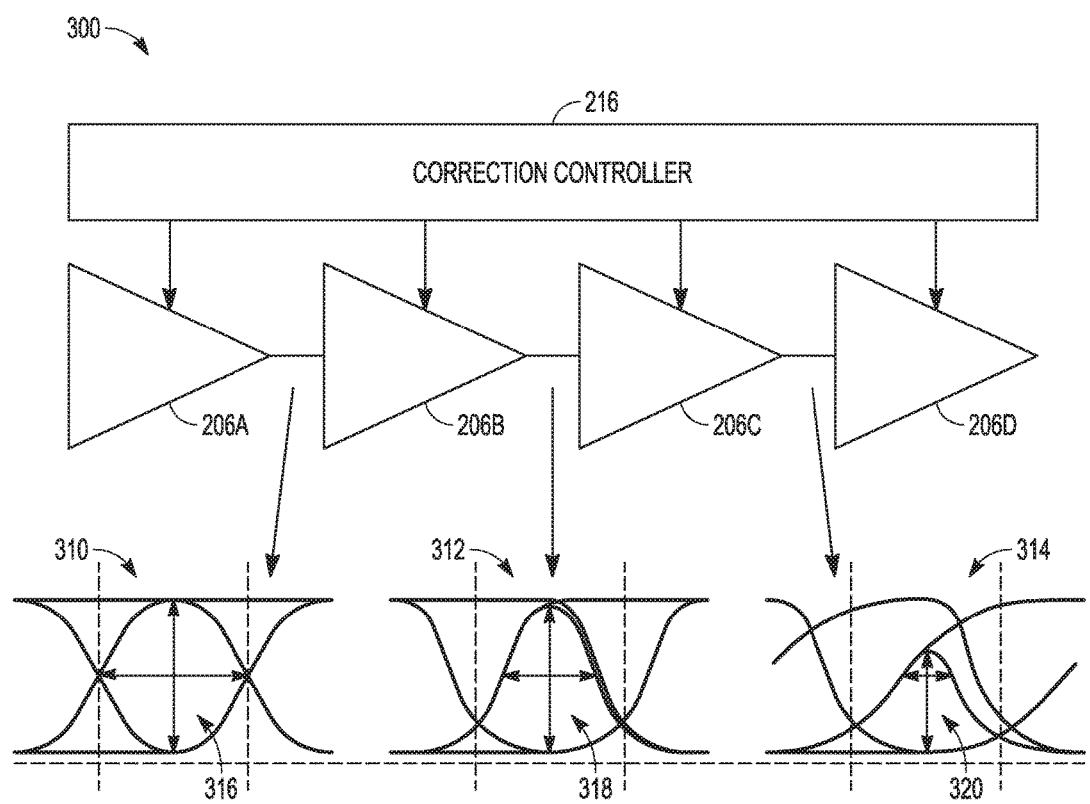
FIG. 3 is a diagram showing one example of a cascade including row buffers from FIG. 2 and illustrating signal distortion caused by Duty Cycle Distortion (DCD).

FIG. 3 is a diagram showing one example of a cascade 300 including row buffers 206A, 206B, 206C, 206D from FIG. 2 and illustrating distortion (e.g., inter-symbol interference (ISI)) due to DCD. FIG. 3 also shows the row correction controller 216 and eye diagrams 310, 312, 314 illustrating ISI. Also, although row buffers 206A, 206B, 206C, 206D are shown in FIG. 3, the ISI effects illustrated may be the same or similar in column buffers and/or cascaded buffers implemented outside of a crosspoint switch. Also, in FIG. 3, the correction controller may include and/or be in communication with a communication controller 217. The communication controller 217 may be configured to provide correction signals to different buffers 206A, 206B, 206C, 206D. For example, the communication controller 217 may provide signals one or more communication busses, similar to the bus 402 described below with respect to FIG. 4.

Eye diagrams 310, 312, 314, 316 illustrate the quality or sharpness of transitions between logical zeros and logical ones in the signal. For example, the eye diagrams 310, 312, 314 at FIG. 3 show a series of transitions between logical zero and logical one. As shown herein, the eye diagrams 310, 312, 314 describe signals between the buffers 206A, 206B, 206C, 206D either before calibration or while the row correction controller 216 is not providing a correction signal. For example, when proper calibration signals are provided to the buffers 206A, 206B, 206C, 206D, ISI may be less than what is shown in FIG. 3.

Eye diagram 310 shows state transitions of an example signal between the buffer 206A and the buffer 206B. As illustrated by the arrows, an opening or eye 316 in the eye diagram 310 has a height about equal to its width. This may indicate that duty cycle distortion at the buffer 206A is minimal and that transitions between logical zero and logical one are detectable. Eye diagram 312 shows state transitions of another example signal between the buffer 206B and the buffer 206C. As shown, the opening or eye 318 has a height comparable to the height of the eye 316, but a width of the eye 318 is reduced. This may indicate, for example, that DCD at the buffer 206B has shifted transitions between logical zero and logical one. Eye diagram 314 shows state transitions of another example signal between buffer 206C and 206D. As illustrated, the DCD caused by the buffer 206B is compounded by additional DCD caused by buffer 206C. For example, between buffers 206C and 206D, the DCD is more likely to cause ISI, generating a risk that symbols (e.g., portions of the signal corresponding to either logical zero or logical one) will be lost. Once a symbol is lost it may be difficult or even impossible to recover. In some examples, a correction controller may modify the correction signals provided to the buffers 206B, 206C to correct for the illustrated DCD.

Figure 3A:
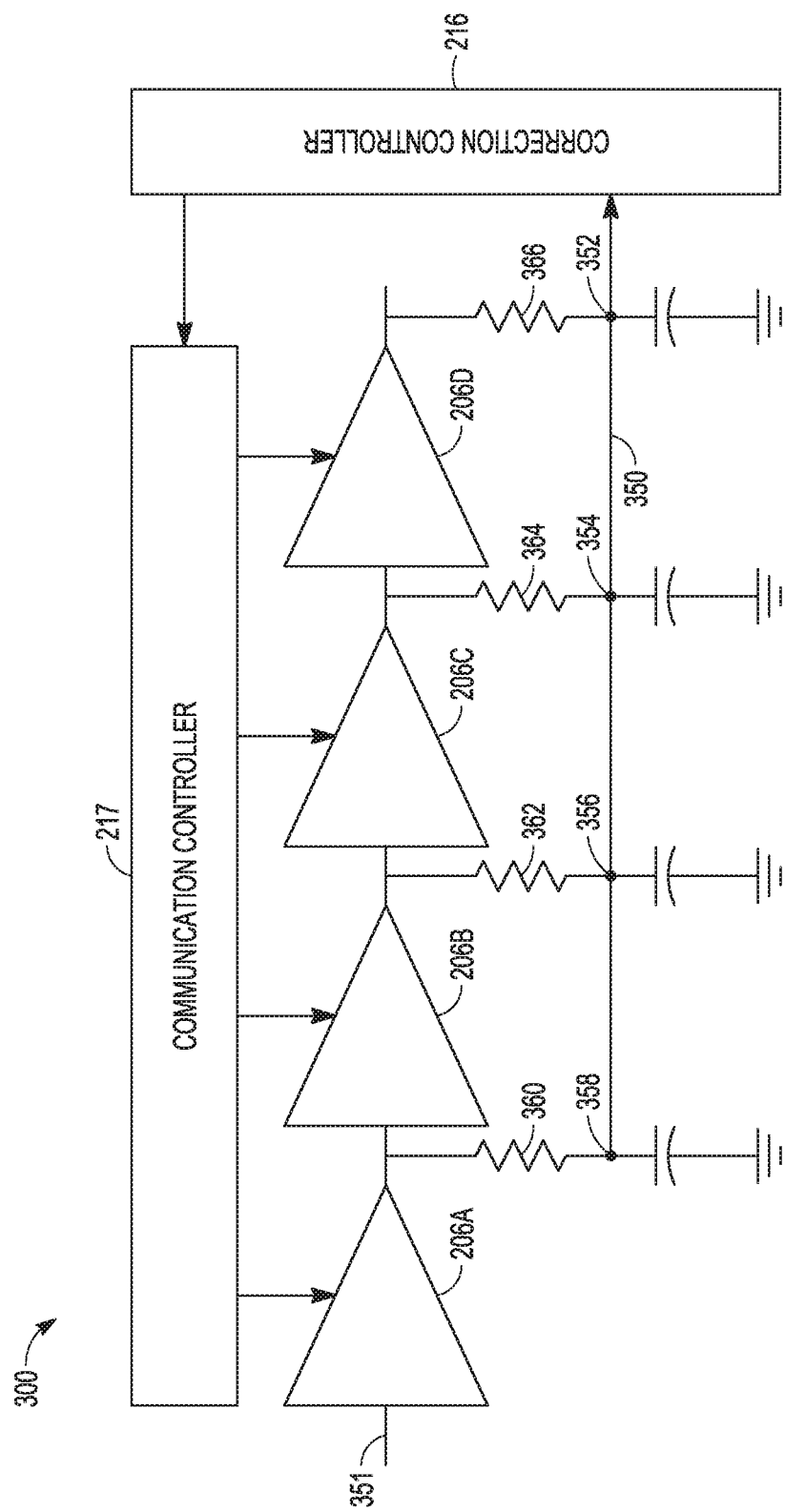
FIG. 3A is a diagram showing another example of the cascade of FIG. 3 including additional components.

FIG. 3A is a diagram showing another example of the cascade 300 of FIG. 3 including additional components. For example, the communication controller 217 is shown in position to provide correction signals to the respective buffers 206A, 206B, 206C, 206D, for example, as described herein. FIG. 3A also shows return line 350 to enable the correction controller 216 to receive the output of less than all of the cascade 300. For example, an input signal (e.g., generated by a test signal generator 220A-H) may be provided at input 351. The return line 350 may comprise various switches 352, 354, 356, 358. The communication controller 217 and/or correction controller 216 may selectively open or close the switches to receive the output of a subset of the cascade 300. For example, when switch 358 is closed, the output of the buffer 206A may be provided to the correction controller 216 via return line 350. Similarly, when switch 356 is closed, the output of the combination of the buffers 206A and 206B may be provided on the return line 350. When switch 354 is closed, the output of the combination of buffers 206A, 206B, and 206C may be provided on the return line 350. When switch 352 is closed, the output of the combination of buffers 206A, 206B, 206C, and 206D may be provided to the correction controller 216. In some examples, resistors 360, 362, 3640, 366 and capacitors 358, 356, 354, 352 may be utilized, as shown, to generate a low-pass version of the signal that is proportional to the amount of DCD present in the signal.

Figure 4:
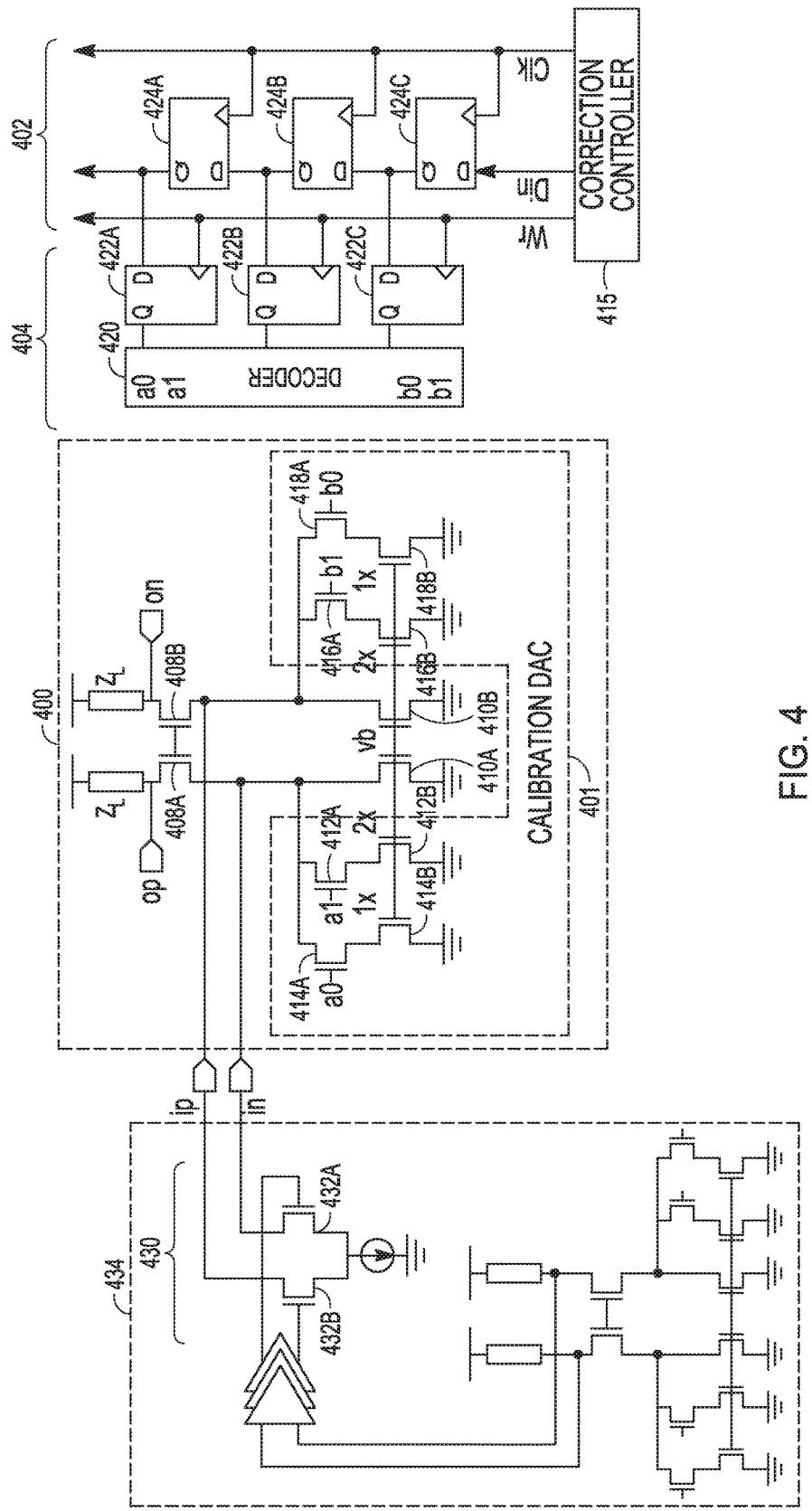
FIG. 4 is a diagram showing one example of a buffer and a portion of a communication bus for providing a correction signal from a correction controller to the buffer.

FIG. 4 is a diagram showing one example of a differential buffer 400 and a portion of a communication bus 402 for providing a correction signal from a correction controller to the buffer 400. The buffer 400 may be implemented as part of the crosspoint switch 200 and/or as part of a cascade of buffers outside of a crosspoint switch. When the buffer 400 is implemented as part of the crosspoint switch 200, it may be a row buffer or a column buffer. The buffer 400 includes a signal path that may include transistors 408A, 408B, 410A, 410B. For reference an output stage 430 of another buffer 434 is electrically coupled prior to the buffer 400 as shown. For example, in the context of a crosspoint switch, the buffer 434 may be in the same row as the buffer 400 but in a different column. The output stage includes transistors 432A, 432B. The transistors 408A, 408B, 410A, 410B, 432A, 432B may be any suitable type of transistor or switch, for example, field effect transistors (FETs) such as Metal Oxide Field Effect Transistors (MOSFETs), Junction Field Effect Transistors (JFETs), etc. Also, in some examples, other types of transistors, such as bi-polar junction (BJT) transistors may be used.

An input to the buffer 400 (e.g., via the output stage 430 of the buffer 434 and/or from inputs such as 201) may be applied to the sources of transistors 408A, 408B, 410A, 410B in the form of a current. Input current (e.g., from an input stage 430 and/or prior buffer) may be conveyed to the drain of transistor 408A, which may draw current through load impedance ZL. In some examples, the gates of the transistors 408A and 408B may be electrically coupled to a common bias voltage source, which may have a constant voltage value. A positive output of the buffer 400 (op) may be taken at the drain of transistor 408A. A negative output of the buffer 400 (on) may be taken at the drain of the transistor 408B. When the input current from op in FIG. 4 is positive and input current from on is negative, the output op is pulled low and output on is pulled high. Similarly, when the input current from op in FIG. 4 is negative and input current from on is positive, the output op is pulled high and output on is pulled low. In some examples, the buffer 400 includes an output stage similar to the output stage 430 of the buffer 434.

The value of the output may depend on the current drawn at the positive output op and the negative output on. For example, if a positive side output stage transistor 432B of the prior buffer 434 is not well matched to the negative side output stage transistor 432A, then one transistor 432A, 432B may draw more current than the other for equivalent values of the input signal. This may, in turn, lead to distortion in the output signal, resulting in DCD and/or ISI, for example, as illustrated and described in FIG. 3. Similar mismatch may occur between positive side transistors 408A, 410A and negative side transistors 408B, 410B of the buffer 400.

In the example shown in FIG. 4, the buffer 400 also includes a parameter correction unit 401. The parameter correction unit 401 includes sets of correction transistors 412A, 412B; 414A, 414B; 416A, 416B; and 418A, 418B. These transistors may also be any suitable type of transistor or switch such as, for example, FETs. The sets of correction transistors 412A, 412B; 414A, 414B; 416A, 416B; and 418A, 418B may be wired to receive a digital control signal comprising bits a0, a1, b1, b0 and, in response, to selectively provide additional current to the positive side or the negative side the buffer 400 to correct for mismatch between the positive and negative-side transistors at the buffer 400 and/or input stage 430. For example, the sets of correction transistors may act as a digital-to-analog converter (DAC) The set of correction transistors 414A, 414B may be coupled in series between a source of the transistor 410A and ground, as shown, to provide a supplemental positive side current source. A gate of the transistor 414B may be electrically coupled to the gate of the transistor 410A and a source of the transistor 414B may be electrically coupled to ground, similar to the transistor 410B. In this way, the Vgs of the transistor 414B may track that of the transistor 410A (e.g., when the transistor 410A is in saturation, the transistor 414B may also be in saturation). The gate of the transistor 414A may be electrically coupled to receive control signal bit a0 (e.g., from decoder 420). The control signal bit a0, in some examples, may have a high value and a low value. When the control signal bit a0 takes the low value, the Vgs may place the transistor 414A in the cut-off region and no current may flow through the set of correction transistors 414A, 414B. When the control signal bit a0 is high, the Vgs of transistor 414A may turn on transistor 414A. (For example, the transistor 414A may be in triode and/or saturation mode.) Accordingly, when the positive-side transistors 408A, 410A draw current through the load $Z_{LA}$, the set of correction transistors 414A, 414B may draw additional current to supplement the current drawn by the transistors 408A, 410A.

The set of correction transistors 412A, 412B may be coupled in parallel between a drain of the transistor 410A and ground, as shown, to provide a supplemental positive side current source. A gate of the transistor 412B may be electrically coupled to the gate of the transistor 410A and a source of the transistor 412B may be electrically coupled to ground, similar to the transistor 410B. In this way, the Vgs of the transistor 412B may track that of the transistor 410A (e.g., when the transistor 410A is in saturation, the transistor 412B may also be in saturation). The gate of the transistor 412A may be electrically coupled to receive control signal bit a1 (e.g., from decoder 420). The control signal bit a1, in some examples, may have a high value and a low value. When the control signal bit a1 takes the low value, the Vgs may place the transistor 412A in the cut-off region and no current may flow through the set of correction transistors 412A, 412B. When the control signal bit a1 is high, the Vgs of transistor 412A may turn on transistor 412A. Accordingly, when the positive-side transistors 408A, 410A draw current through the load $Z_{LA}$, the set of correction transistors 412A, 412B may draw additional current to supplement the current drawn by the transistors 408A, 410A.

The set of correction transistors 416A, 416B may be coupled in series between a source of the transistor 410B and ground, as shown, to provide a supplemental negative side current source. A gate of the transistor 416B may be electrically coupled to the gate of the transistor 410B and a source of the transistor 416B may be electrically coupled to ground, similar to the transistor 410B. In this way, the Vgs of the transistor 416B may track that of the transistor 410B (e.g., when the transistor 410B is in saturation, the transistor 416B may also be in saturation). The gate of the transistor 416A may be electrically coupled to receive control signal bit b1 (e.g., from decoder 420). The control signal bit b1, in some examples, may have a high value and a low value. When the control signal bit b1 takes the low value, the Vgs may place the transistor 416A in the cut-off region and no current may flow through the set of correction transistors 416A, 416B. When the control signal bit b1 is high, the Vgs of transistor 416A may turn on transistor 416A. Accordingly, when the negative-side transistors 408B, 410B draw current through the load $Z_{LB}$, the set of correction transistors 416A, 416B may draw additional current to supplement the current drawn by the transistors 408B, 410B.

The set of correction transistors 418A, 418B may be coupled in series between a source of the transistor 410B and ground, as shown, to provide a supplemental negative side current source. A gate of the transistor 418B may be electrically coupled to the gate of the transistor 410B and a source of the transistor 418B may be electrically coupled to ground, similar to the transistor 410B. In this way, the Vgs of the transistor 418B may track that of the transistor 410B (e.g., when the transistor 410B is in saturation, the transistor 418B may also be in saturation). The gate of the transistor 418A may be electrically coupled to receive control signal bit b0 (e.g., from decoder 420). The control signal bit b0, in some examples, may have a high value and a low value. When the control signal bit b0 takes the low value, the Vgs may place the transistor 418A in the cut-off region and no current may flow through the set of correction transistors 418A, 418B. When the control signal bit b0 is high, the Vgs of transistor 418A may turn on transistor 418A. Accordingly, when the negative-side transistors 408B, 410B draw current through the load $Z_{LB}$, the set of correction transistors 418A, 418B may draw additional current to supplement the current drawn by the transistors 408B, 410B.

The control signal bits a0, a1, b0, b1 may be selectively asserted to correct for a mismatch between the positive and negative sides of the buffer 400. For example, if the positive side draws less current than the negative side (e.g., op is less than on for equivalent values of the input signal), then the correction controller (e.g., 214 and/or 216) may assert one or both of the control signal bits a0, a1 to draw additional current through the positive side of the buffer 400. If the negative side draws less current (e.g., on is less than op for equivalent values of the input signal), then the correction controller may assert one or both of the control signals b0, b1 to draw additional current through the negative side of the buffer 400.

FIG. 4 also shows a portion of a communication bus 402. The communication bus 402 may extend from a correction controller 415 to the buffer 400. In some examples the communication bus 402 may also extend to other buffers of a crosspoint switch such as, for example, other buffers in the same position as the buffer 400 in their respective rows or columns. The correction controller 415 may include, and/or be in communication with a communication controller for managing the bus 402. In some examples, the buffer 434 is also coupled to the communication bus 402 and/or another communication bus in communication with the correction controller 415. In this way, the buffer 434 may also receive a digital correction signal in a manner similar to that described with respect to the buffer 400.

The example communication bus 402 shown in FIG. 4 comprises three lines, a clock line (Clk), a data input line (Din) and a write enable (Wr). The bus 402 may also include memory elements 424A, 424B, 424C. The memory elements 424A, 424B, 424C may include flip-flops or any other suitable memory element. The data in line (Din) (e.g., an output of a memory element (not shown) of a buffer positioned on the data in line (Din) before the buffer 400) may be electrically coupled to a data input (D) of the memory element 424C. An output (Q) of the memory element 424C may be electrically coupled to the data input (D) of the memory element 424B. An output (Q) of the memory element 424B may be provided to the data input (D) of the memory element 424A. An output (Q) may be electrically coupled to a memory element (not shown) of the next buffer (not shown) on the communications bus 402.

Clock inputs of the respective memory elements 424A, 424B, 424C may be electrically coupled to the clock line Clk. In addition to being electrically coupled to the next memory element 424A, 424B, the outputs (Q) of the memory elements 424A, 424B, 424C may also be coupled to the data inputs (D) of respective memory elements 422A, 422B, 422C. Outputs (Q) of the memory elements 422A, 422B, 422C may be provided to a decoder 420. The write enable (Wr) may be electrically coupled to the clock inputs of the memory elements 422A, 422B, 422C.

In the example of FIG. 4, there are four control signals a0, a1, b0, b1, each of which may take two values, high and low. Accordingly, there are 2^4 or 16 different combinations of values of the control signals. In some examples, the correction controller may not add supplemental current to both the positive and negative side of the buffer 400 at the same time, meaning that there are eight (8) allowable combinations of the four control signals a0, a1, b0, b1. Eight (8) allowable values can be represented by three binary digits. Accordingly, the digital correction signal for the buffer 400 in the example of FIG. 4 may comprise three bits. For this reason, the communication bus 402, in the example of FIG. 4, includes three memory elements 424A, 424B, 424C and three memory elements 422A, 422B, 422C. Each memory element may store one bit of the digital correction signal.

According to the circuit described, the correction controller 415 may serially shift a set of bits corresponding to the correction signal for the buffer 400 onto the memory elements 424A, 424B, 424C. For example, the correction controller 415 may provide a first bit of the correction signal is at the input (D) of the memory element 424C, the correction controller may cycle the clock signal on line Clk to put the first bit on the output (Q) of the memory element 424C and the input (D) of the memory element 424B. The correction controller 415 may provide a second bit of the correction signal at the input (D) of the first memory element 424A and cycle the clock on line Clk to transfer the first bit to the output (Q) of the memory element 424B and the second bit of the correction signal to the output (Q) of the memory element 424B. The correction controller 415 may provide a third bit of the correction signal at the input (D) of the first memory element 424A and again cycle the clock on line Clk to transfer the third bit to the output (Q) of the memory element 424C, the second bit of the correction signal to the output (Q) of the memory element 424B, and the first bit to the output (Q) of the memory element 424A.

According, the first, second, and third bits of the correction signal may be provided at the inputs (D) of the memory elements 422A, 422B, and 422C. The correction controller may then cycle the write enable (Wr), which may transfer the first, second, and third bits of the correction signal to the outputs (Q) of the memory elements 422A, 422B, 422C and to an input of the decoder 420. The decoder 420 may be configured to decode the first, second, and third bits of the correction signal to values for the control signals a0, a1, b0, b1. It will be appreciated, however, that FIG. 4 shows just one example of a signal component (e.g., buffer 400) and communication arrangement for providing the correction signal to the signal component. Other suitable buffer and/or communication arrangements may be used.

In various examples, the structure of the buffer 400, communication bus 402 and 404 may be modified from the arrangement shown in FIG. 4. For example, the buffer 400 (e.g., calibration DAC 401) may include more or fewer sets of supplemental transistor pairs, such as 412A, 412B, 414A, 414B, 416A, 416B, 418A, 418B on the positive and/or negative sides of the buffer 400. This may lead to a different number of control signals, a different number of allowable combinations of the control signals, and hence, a different number of memory elements in the communications bus 402 and/or 404 to represent the bits of the digital correction signal.

Figure 4A:
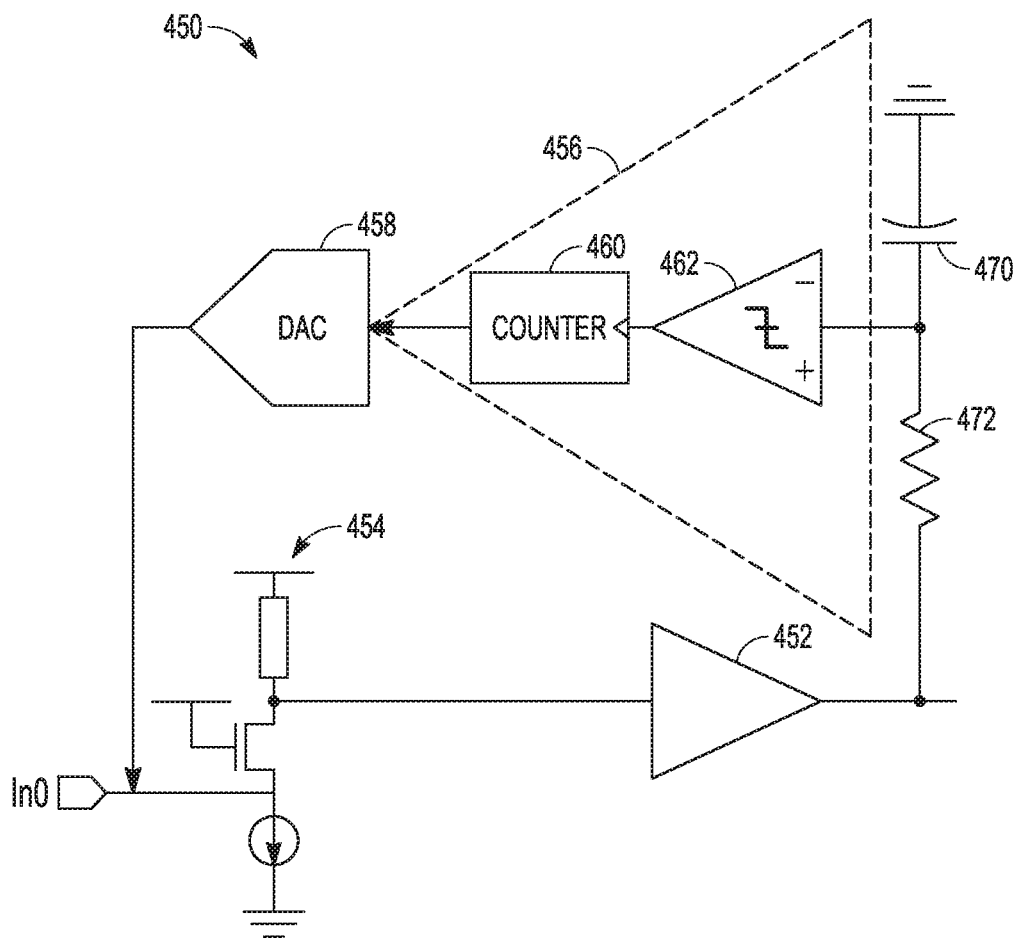
FIG. 4A is a diagram showing one example circuit showing a determination of a correction signal for a first buffer in a cascade of buffers.

FIG. 4A is a diagram showing one example circuit 450 showing a determination of a correction signal for a first buffer in a cascade of buffers. For example, it may be desirable to calibrate for DCD introduced by a test signal generator, such as 220A-220H described above. An input signal (e.g., generated by a test signal generator) may be received at In0, for example, from a test signal generator (e.g., 220A-220H). The input may be provided to the source of a gate connected field effect transistor (FET) 454, generating a voltage at the drain of the FET 454, which may be provided to the buffer. The gate connected FET 454, for example, may be all or part of an input stage to the buffer 452, for example, similar to the input stage 430 described herein above. An output of the buffer 452 may be provided to a first buffer calibration circuit 456 and Digital to Analog Converter (DAC) 458.

The output of the buffer 452 may be provided to a low-pass filter, represented in FIG. 4A with resistor 472 and capacitor 470. A low-pass filtered signal may be provided to the buffer calibration circuit 456. In some examples, the low-pass filter may be included in the calibration circuit 456. The low-pass filtered signal may be provided to a comparator 462, which may compare the low-pass filtered signal to zero (e.g., the negative input terminal of the comparator may be tied to ground). Accordingly, the output of the comparator may be a logical one if the input is a logical one (e.g., higher than a threshold voltage). A counter 460 may sum the output of the comparator at successive cycles. DAC 458 may convert the output of the counter 460 to an analog signal, which may be provided at the input In0 to correct for DCD in the test signal generator and/or buffer 452.

Figure 5:
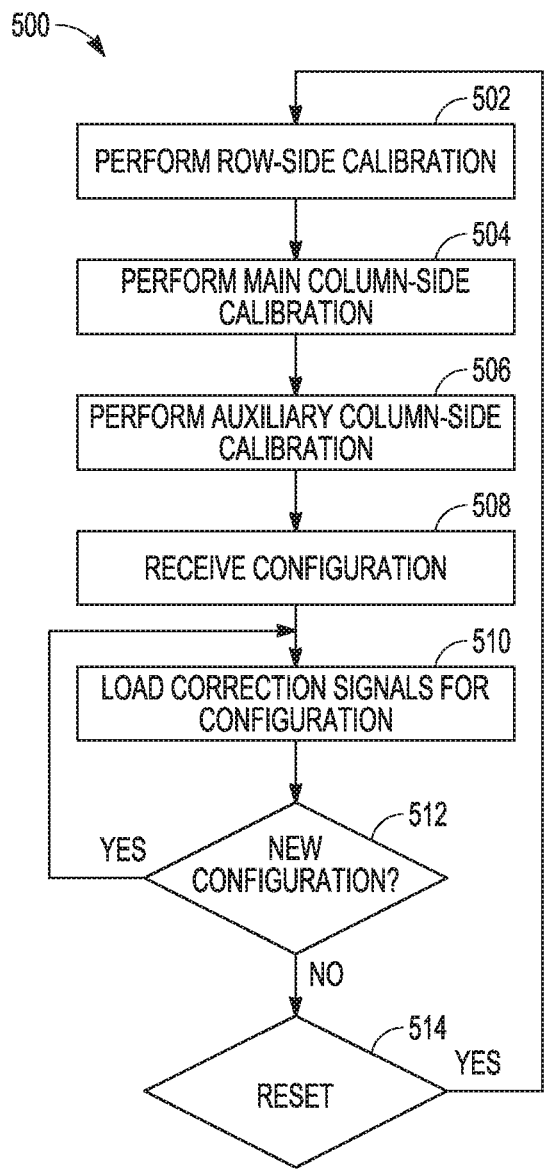
FIG. 5 is a flowchart showing one example of a process flow that may be executed by one or more of the correction controllers of FIG. 2 to determine correction signals for buffers of the crosspoint switch of FIG. 2 and apply appropriate correction signals for a given switch mapping.

FIG. 5 is a flowchart showing one example of a process flow 500 that may be executed by one or more of the correction controllers 214, 215 of FIG. 2 to determine correction signals for buffers of the crosspoint switch 200 of FIG. 2 and apply appropriate correction signals for a given switch mapping. The process flow 500 may begin when the crosspoint switch is powered-up or when actuated by a user. At action 502, the row correction controller 216 may perform row-side calibration. During row-side calibration, the row correction controller 216 may determine correction signals for row buffers (e.g., all row buffers) in the crosspoint switch 200. The row correction controller may determine the correction signals to minimize DCD introduced by the buffer and reduce ISI in the crosspoint switch 200. An example process for performing row-side calibration is described herein with reference to FIGS. 6-10.

The column correction controller 214 may calibrate column buffers. In some examples, the column correction controller 214 may perform separate main and auxiliary calibrations. For example, depending on the configuration of the crosspoint switch 200, a column buffer may receive an input from a row buffer through the switch of a point-cell or from another column buffer. During main column-side calibration, at action 504, the column correction controller 214 may determine correction signals for column buffers for different combinations of the column buffer and closed point-cells. Additional examples describing main column-side calibration are described herein with respect to FIGS. 11-25. During auxiliary column-side calibration, at action 506, the column correction controller 214 may determine correction signals for column buffers in configurations that receive input from other column buffers. Additional examples describing auxiliary column-side calibration are described herein with respect to FIGS. 26-29.

At 508, the crosspoint switch 200 (e.g., a controller thereof) may receive a configuration. The configuration may describe an input, selected from the inputs 201, and an output, selected from the outputs 203 that are to be connected. The received configuration may be implemented by closing a point-cell that intersects both a row path 202 corresponding to the selected input and a column path 204 corresponding to the selected output. At action 510, the column correction controller 214 may load correction signals for column buffers. The loaded correction signals may correspond to the configuration received at action 508. For example, if a column buffer is positioned in the resulting signal path as the first column buffer after the closed point-cell, then the column buffer may have an appropriate main correction signal loaded. (If the column buffer is the first column buffer on the signal path after the closed point-cell, it may receive its input from a row buffer through the closed point-cell.) For column buffers that are not the first column buffer after the closed point-cell, then the column correction controller 214 may load the auxiliary correction signal for the respective column buffers.

In some examples, auxiliary correction signals may be loaded to column buffers by default (e.g., during the calibration process). Accordingly, the column correction controller 214 may modify the calibration signal for a column buffer if it is the first column buffer after the closed point-cell, in which case the appropriate main correction signal may be loaded, or if it was the first column buffer after the closed point-cell in a previous switch configuration but is not in the configuration received at action 508, in which case the auxiliary correction signal may be loaded or re-loaded. In some examples, the correction signals for row buffers may not depend on the configuration of the crosspoint switch. For example, correction signals for row buffers may be loaded during calibration and may not change until a new calibration is performed. Correction signals for row buffers may be loaded, for example, as described herein with respect to FIG. 4. When correction signals are loaded to the buffers in the signal path corresponding to the configuration received at action 508, the crosspoint switch 200 may operate with reduced DCD and ISI.

At action 512, the crosspoint switch 200 may determine whether a new configuration is received (e.g., a new signal path involving the closing of a different point-cell). If a new configuration is received, the crosspoint switch 200 may return to action 510 and load correction signals for the new configuration as described. If no new configuration is received at action 512, the crosspoint switch 200 may determine if a reset command is received at action 514. If a reset command is received, the crosspoint switch 200 may return to action 502 and perform a new calibration.

Figure 6:
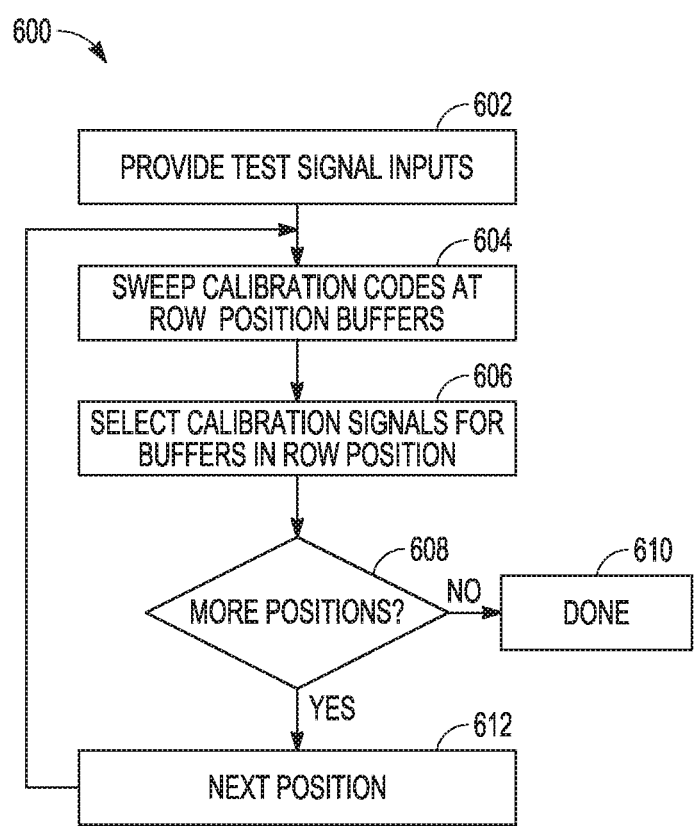
FIG. 6 is a flowchart showing one example of a process flow for performing row-side calibration.

FIG. 6 is a flowchart showing one example of a process flow 600 for performing row-side calibration. The process flow 600 shows one example way that the row correction controller 216 may perform the action 502 of the process flow 500 described above. At action 602, the row correction controller 216 may provide a test signal to the inputs 201 of the crosspoint switch 200. This may include providing the test signal to row buffers at a first row position 250 (FIGS. 7-10). Row positions may include buffers that are at a common position (e.g., first, second, third, etc.) along signal paths beginning at different inputs 201. For example, FIGS. 7-10 are diagrams showing examples of the crosspoint switch 200 that illustrate row positions. Referring to FIG. 7, a first row position 250 includes row buffers that are electrically coupled to one of the inputs 201 of the crosspoint switch 200 and, therefore, are in the first position on signal paths originating at the inputs 201. FIG. 8 also shows a second row position 252 that includes row buffers that are electrically coupled to row buffers in the first row and, therefore, are in the second position on signal paths originating at the inputs 201. FIG. 9 shows a third row position 254 that includes row buffers that are electrically coupled to row buffers in the second row position 252 and, therefore, are in the third position on signal paths originating at the inputs 201. FIG. 10 shows a fourth row position 256 that includes row buffers that are electrically coupled to row buffers in the third row position 254 and, therefore, are in the fourth position on signal paths originating at the inputs 201.

Referring back to FIG. 6, at action 604, the row correction controller 216 may sweep test calibration signals to row buffers at the first row position 250. In examples where the row buffers are configured as described in FIG. 4, this may include serially shifting different test calibration signal values to the various row buffers in the first row position over the communication bus 402. In some examples, each row position may have a separate communication bus, similar to the communication bus 402. In some examples, the row correction controller 216 may sweep every permutation of test correction signals to each row buffer in the first row position 250. In some examples, the row correction controller 216 may sweep test correction signals to a row buffer until a DCD observed at the row buffer is below a threshold, at which point no further correction signals may be applied to the row buffer.

At action 606, the row correction controller 216 may select calibration signals for row buffers in the first row position 252 (e.g., from the test calibration signals provided at action 604). The selection may be based, at least in part, on outputs of the buffers in the first row position 252 in response to the test signal. For example, the row correction controller 216 may apply a low-pass filter to the output of each of the row buffers at the first row position 252 to generate filtered outputs of the row buffers. If the value of the filtered output is below a threshold, it may indicate a low or acceptable DCD. If the value of the filtered output is above the threshold, it may indicate a high or unacceptable. For example, the correction controller 216 may select for any given buffer the correction signal that generates the highest positive filtered output.

At action 608, the correction controller 216 may determine if there are more row positions to be calibrated. If no, calibration of the row buffers may be completed at action 610. If no, the correction controller may move to the next row position and return to action 604 to sweep test calibration signals to row buffers at the next row position. For example, referring to FIG. 8, after calibration signals are selected for row buffers in the first row position 250, the outputs of the row buffers in the first row position 250 may exhibit corrected outputs with low or acceptable DCD. Accordingly, the row buffers in the next row position 252 may receive at their inputs the calibrated outputs of the row buffers at the first row position 250. The row correction controller, then, may select correction signals for the row buffers at the second row position 252 at actions 604 and 606 based on the calibrated outputs of the row buffers at the first row position 250. This process may continue until all correction signals are selected for all row buffers.

Although the process flow 600 is described in terms of row buffer positions, in some examples, the same concepts may be applied to a single cascade of buffers or other signal components. For example, a correction controller may apply a test signal to an input of a first signal component and calibrate the first signal component by selecting a correction signal for it based on the output of the first signal component. The correction controller may then select a correction signal for a second signal component in the cascade based on the output of the second signal component when receiving the calibrated output of the first signal component, and so on.

Figure 13:
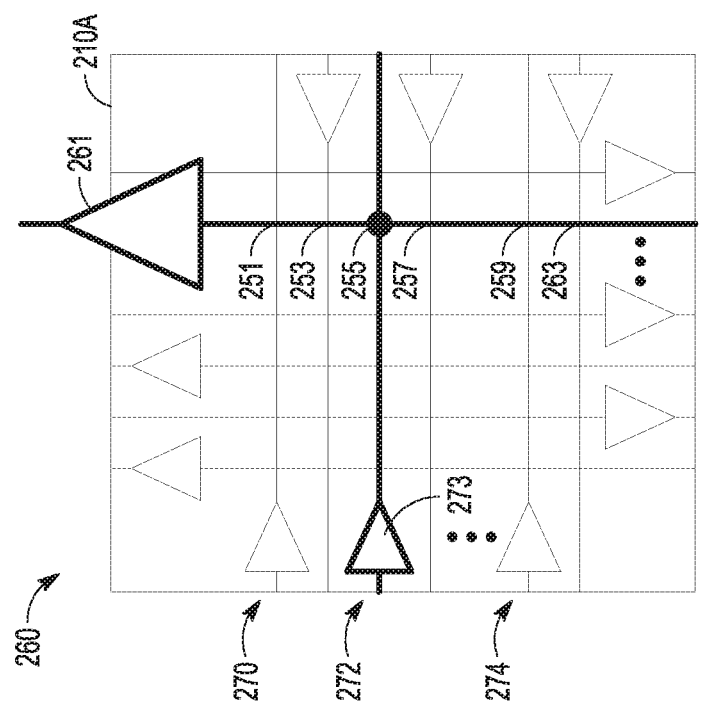
FIGS. 12 & 13 show examples of a tile of the crosspoint switch of FIG. 2.
Figure 12:
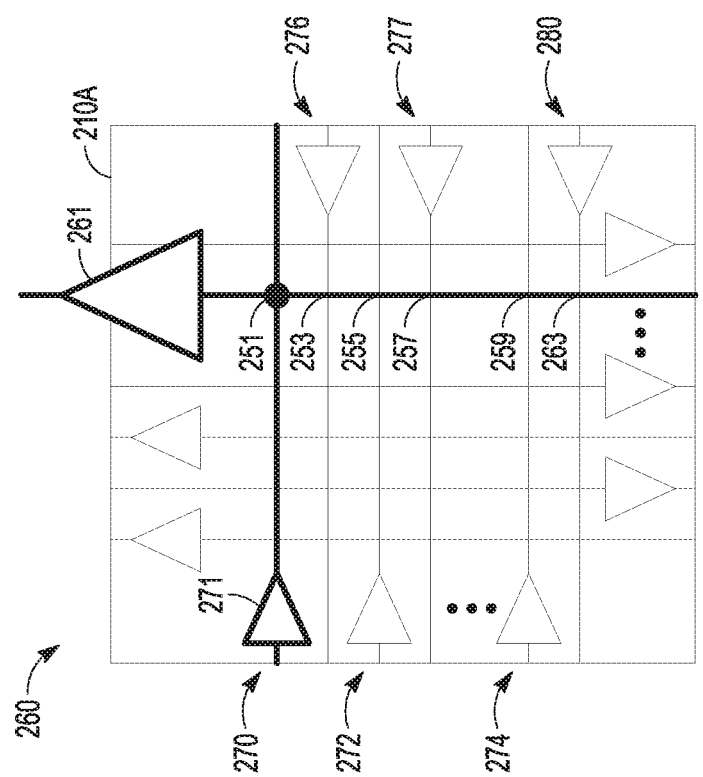

Column buffers of the crosspoint switch 200 may be connectable by point-cells to a subset of the row signal paths 202. Because different point-cells may affect a signal differently, the column correction controller 214 may determine different main calibration signals for a column buffer for different combinations of the column buffer and point-cells that are connectable to the column buffer. FIGS. 12 & 13 show examples of a tile 210A of the crosspoint switch 200 of FIG. 2. The tile 210A includes a column buffer 261 in a first column position 260. In FIG. 12, a first point-cell 251 is closed to connect a first row 270 of row buffers to the column buffer 261. In other words, the input of the column buffer 261 is received from a row buffer 271 via the point-cell 251. In FIG. 13, a point-cell 255 is closed connect a second row 272 of row buffers to the column buffer 261. In other words, the input of the column buffer 261 is received from a row buffer 273 via the point-cell 255. FIGS. 12 & 13 show other point-cells 251, 257, 259, 263 that may be closed to connect the column buffer 261 to various other rows of row buffers in the crosspoint switch. In some examples, the column correction controller 214 may determine different correction signals for column buffers, such as the column buffer 261, for different allowable combinations of column buffers and point-cells.

Figure 11:
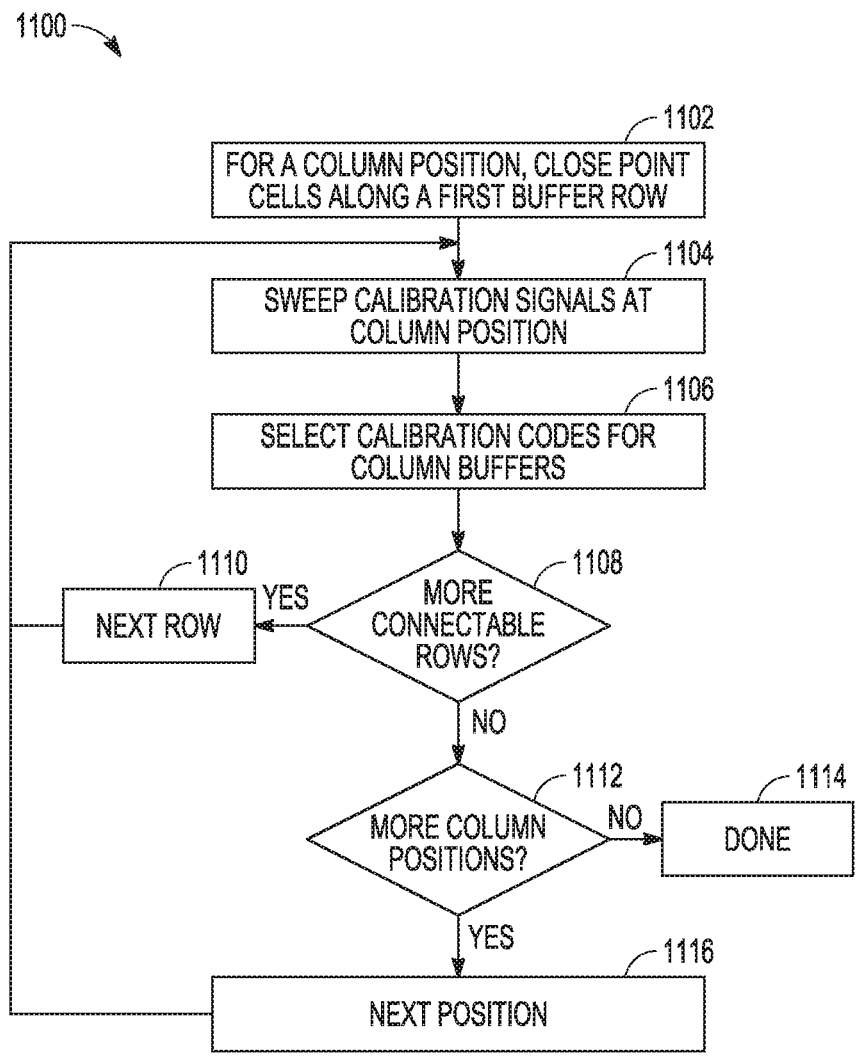
FIG. 11 is a flowchart showing one example of a process flow that may be executed by the column calibration controller to perform main column-side calibration of the column buffers of the crosspoint switch of FIG. 2.

FIG. 11 is a flowchart showing one example of a process flow 1100 that may be executed by the column calibration controller 214 to perform main column-side calibration of the column buffers of the crosspoint switch 200. At action 1102, the column correction controller 214 close point-cells along a first row of row buffers that are connectable to the column buffers at a first column position. This is illustrated at FIG. 14, which shows an example of the crosspoint switch 200 with point-cells along a first row 270 of row buffers closed. As shown, column buffers in the first column position 260 may receive an input signal via a row buffer or row buffers in the row 270 and a closed point-cell along the row 270. At action 1104, the column correction controller 214 may sweep calibration signals to the column buffers at the first column position 260, for example, while providing a test signal to the input corresponding to the row 270. The correction signals, in some examples, may be communicated to the column buffers serially utilizing a bus, similar to the bus 402 described above. At action 1106, the column correction controller 214 may select calibration signals for the column buffers in the column buffer position 260. In some examples, one correction signal may be selected for each column buffer. In some example, correction signals may be selected by examining a low-pass filtered version of the output of the column buffers, for example, similar to what is described above with respect to action 606.

At action 1108, the column correction controller 114 may determine if there are any additional rows that are connectable to the first column position. For example, referring to FIG. 12, the buffer column position 260 may be connectable to, at least rows 270, 272, 274, 276, 278, 280. In some examples, where column buffers are positioned at edges of a tile, column buffers may be connectable to all other signal rows that intersect the same tile such as, for example, tile 210A shown in FIG. 12. If there is another row that is connectable to column buffers in the first column position, the column correction controller 214 may close point-cells in that row at action 1110. (Similarly, the column correction controller 214 may open the point-cells at the previously-considered row.) Fir example, FIG. 15 shows the crosspoint switch 200 configured with point-cells in the row 272 closed while FIG. 16 shows the crosspoint switch 200 with point-cells in the row 280 closed. After closing point-cells in the next row, the column correction controller 114 may proceed to action 1104 and 1106 where it may determine correction signals for the column buffers in the column position 260 with the point-cells of the next row closed.

When no more connectable rows for the column position remain, the column correction controller may determine if there are any remaining column positions. If not, then the process flow may complete at action 1114. If yes, then the column correction controller may increment to the next column position at action 1116 and return to action 1104. Further examples describing the operation of the process flow 1100 are provided at FIGS. 17-25. FIG. 17 shows an example of the crosspoint switch 200 with point-cells along a row 284 in the closed position to calibrate column buffers at a column buffer position 282. FIG. 18 shows an example of the crosspoint switch 200 with point-cells along a row 286 closed, also to calibrate column buffers at the column buffer position 282. FIG. 19 shows an example of the crosspoint switch 200 with point-cells along a row 288 closed, once again to calibrate the column buffers at the column buffer position 282.

FIGS. 17-19 show examples of the crosspoint switch 200 configured to calibrate column buffers at a column buffer position 282. FIG. 17 shows an example of the crosspoint switch 200 with point-cells along a row 284 in the closed position. FIG. 18 shows an example of the crosspoint switch 200 with point-cells along a row 286 also in the closed position. FIG. 19 shows an example of the crosspoint switch 200 with point-cells along a row 288 in the closed position.

FIGS. 20-22 show examples of the crosspoint switch 200 configured to calibrate column buffers at a column buffer position 290. FIG. 20 shows an example of the crosspoint switch 200 with point-cells along a row 292 in the closed position. FIG. 21 shows an example of the crosspoint switch 200 with point-cells along a row 2294 also in the closed position. FIG. 22 shows an example of the crosspoint switch 200 with point-cells along a row 296 in the closed position.

FIGS. 23-25 show examples of the crosspoint switch 200 configured to calibrate column buffers at a column buffer position 298. FIG. 23 shows an example of the crosspoint switch 200 with point-cells along a row 291 in the closed position. FIG. 24 shows an example of the crosspoint switch 200 with point-cells along a row 293 also in the closed position. FIG. 25 shows an example of the crosspoint switch 200 with point-cells along a row 295 in the closed position.

Figure 26:
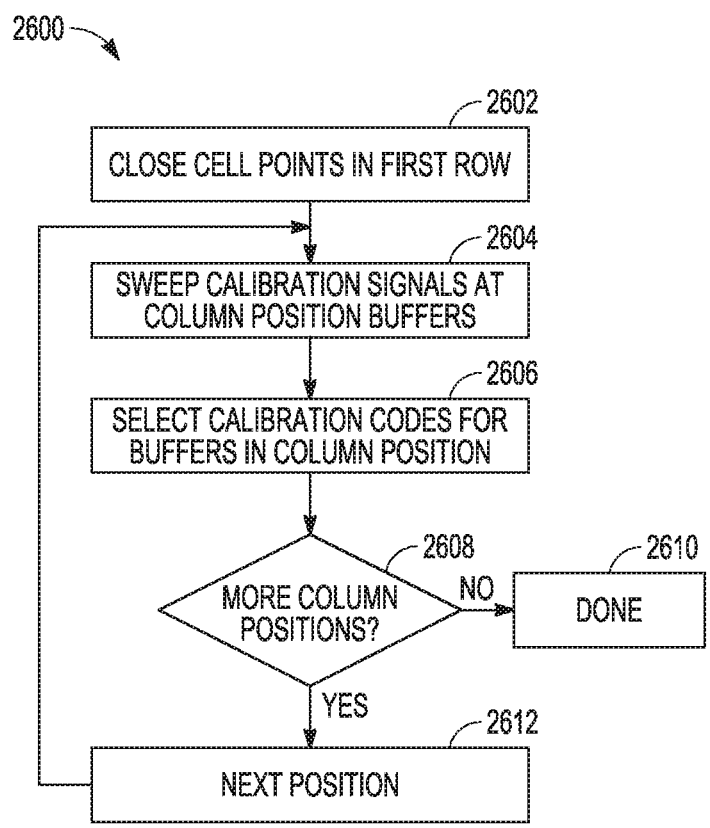
FIG. 26 is a flowchart showing one example of a process flow for performing auxiliary column-side calibration for column buffers in the crosspoint switch of FIG. 2.
Figure 29:
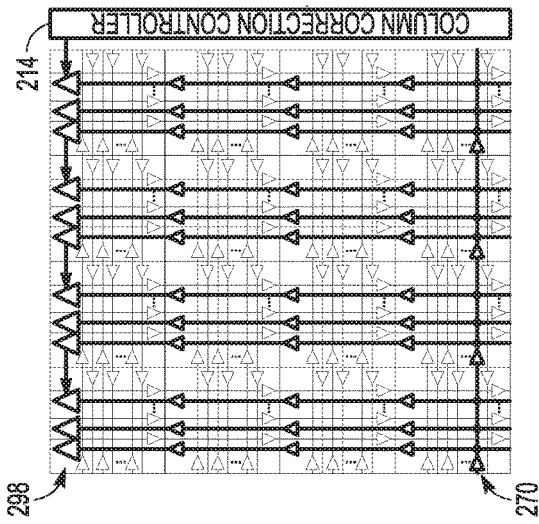
FIGS. 27-29 show examples of the crosspoint switch of FIG. 2 configured to perform auxiliary column-side calibration for column buffers at various column buffer positions.
Figure 28:
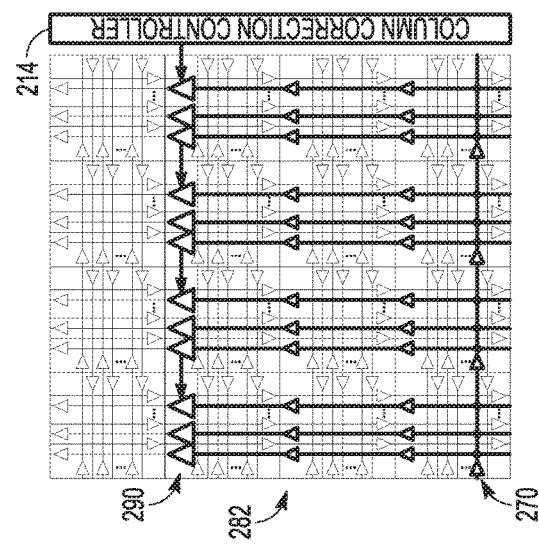
Figure 27:
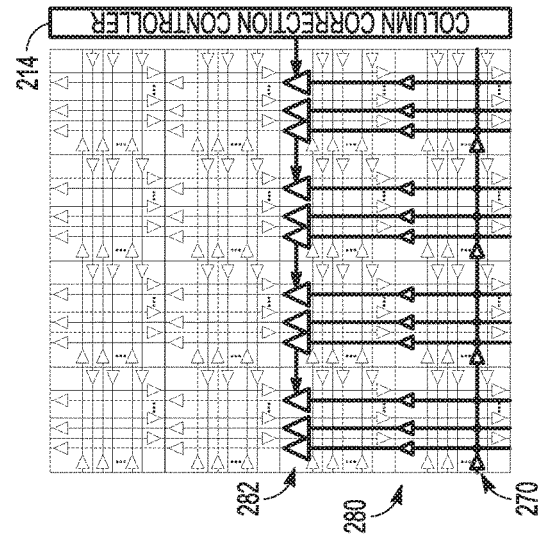

FIG. 26 is a flowchart showing one example of a process flow 2600 for performing auxiliary column-side calibration for column buffers in the crosspoint switch 200. At action 2602, the column correction controller may close point-cells in a row signal path 270. The selected row signal path 270 may be positioned prior to column buffers in the first column position 260. In this way, the closed point-cells may be positioned prior to all column buffers such that an input signal provided at an input corresponding to the row signal path 270 would be received by all column buffers in a given column row path. For example, FIGS. 27-29 show examples of the crosspoint switch 200 configured to perform auxiliary column-side calibration for column buffers at column buffer positions 282, 290, 298. In FIGS. 27-29, point-cells on row signal path 270 are closed. In this way, a test signal provided to an input 201 corresponding to the row signal path 270 may be available to all column buffers.

At action 2604, the column correction controller 214 may sweep test calibration signals for buffers at a given column buffer column position, for example, while providing a test signal at the input 201 corresponding to the row signal path 270. The column correction controller 214 may begin with a column position 282 that does not receive inputs from a row buffer via a closed point-cell. For example, when point-cells in the row signal path 270 are closed, column buffers at column position 260 may not be calibrated. Instead, in some examples, the column correction controller 214 may load to the column buffers at column position 260 the correction signals determined for those buffers when point-cells on the first row signal path 270 are closed. When a test signal is provided to the input corresponding to the row signal path 270, it may be received by the, now-corrected, buffers at the column position 260, which may provide a corrected output to subsequent buffer columns.

At action 2606, the column correction controller 214 may select auxiliary correction signals for the column buffers at the column position 282. Auxiliary correction signals may be selected, for example, by low-pass filtering an output of the column buffers at the column position 282 and selecting the correction signal that provides the lowest absolute result, for example, as described herein above with respect to action 606. At action 2608, the column correction controller 214 may determine if there are additional column positions for auxiliary calibration. If not, the process flow 2160 may finish at action 2610. If yes, the column correction controller may return to action 2604 and sweep test calibration signals to column buffers at a next column position. FIG. 28 illustrates an example of this, as it shows correction signals being swept at an example column position 290. While this occurs, column buffers for previously-calibrated column positions (such as 282 in FIG. 28) may be provided with the auxiliary correction signal determined as described above. FIG. 29 shows another example where actions 2604 and 2606 are performed with respect to the column position 298.

At the conclusion of the process flow 2600, in some examples, each column buffer that is not connectable to a point-cell in row signal path 270 may have an auxiliary correction signal. Accordingly, buffers at the first column position 260 may each have a set of main correction signals, with each main correction signal corresponding to a point-cell that is connectable to the column buffer. Column buffers at other buffer positions may have a set of main correction signals corresponding to point-cells connectable to the column buffers and an auxiliary correction signal determined, for example, according to the process flow 2600.

Figure 30:
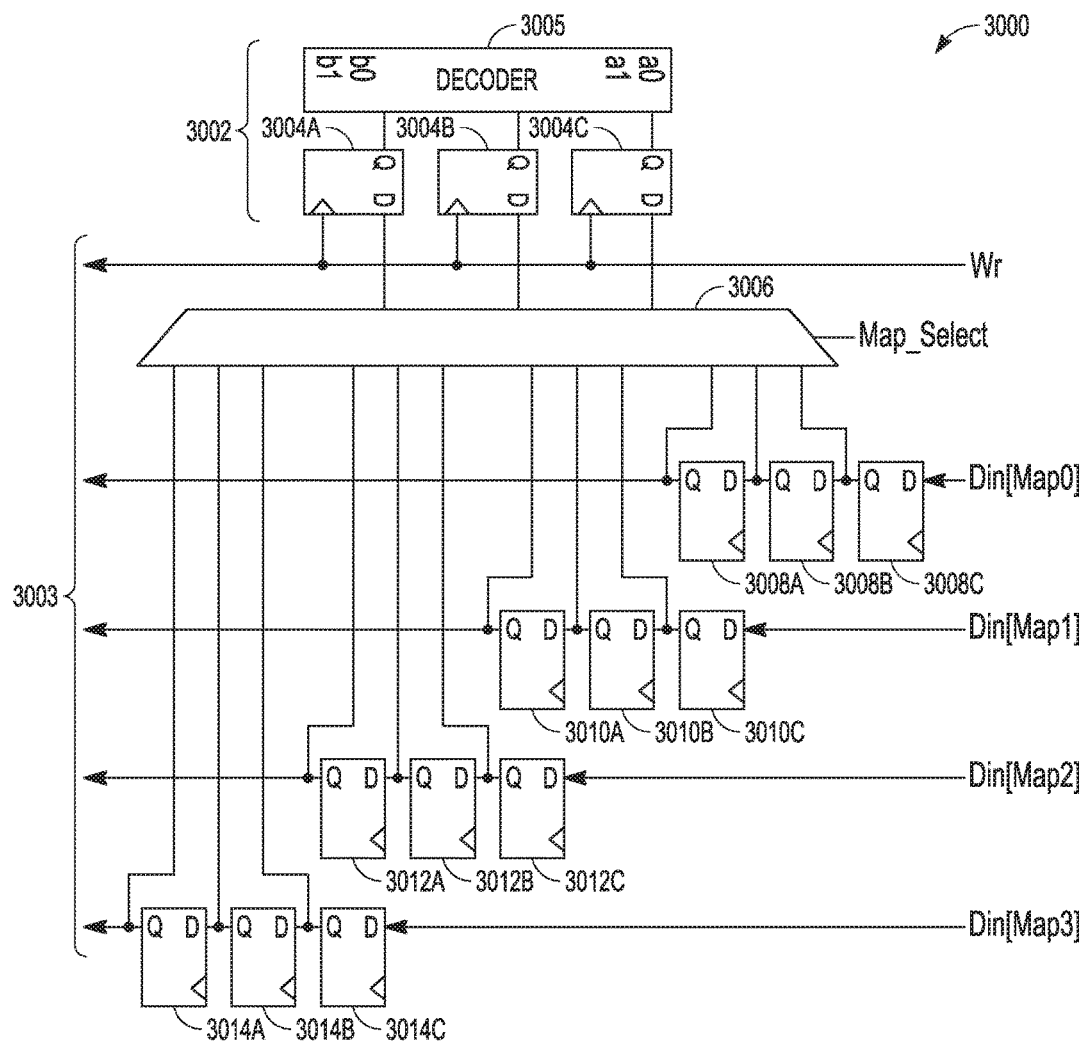
FIG. 30 is a diagram showing one example of a portion of a communication bus that may be used, for example, by the column correction controller to alternately provide different correction signals to column buffers.

FIG. 30 is a diagram showing one example of a portion of a communication bus 3003 that may be used, for example, by the column correction controller to alternately provide different correction signals to column buffers. The communication bus 3003 may be arranged similar to the communication bus 402 in FIG. 4, but may have four data lines, indicated in FIG. 30 by Din[Map0], Din[Map1], Din[Map2], and Din[Map3]. Each data line may have associated memory elements 3008A, 3008B, 3008C, 3010A, 3010B, 3010C, 3012A, 3012B, 3012C, 3014A, 3014B, 3014C. Clock inputs of the memory elements 3008A, 3008B, 3008C, 3010A, 3010B, 3010C, 3012A, 3012B, 3012C, 3014A, 3014B, 3014C may be tied to a common clock line, or separate clock lines. For example, memory elements 3008A, 3008B, 3008C may be tied to a first clock line. Memory elements 3010A, 3010B, 3010C may be tied to a second clock line. Memory elements 3012A, 3012B, 3012C may be tied to a third clock line. Memory elements 3014A, 3014B, 3014C may be tied to a fourth clock line.

The portion of the communication bus 3003 shown in FIG. 30 may correspond to a column buffer that may be arranged, for example, similar to the buffer 400 shown in FIG. 4. For example, decoder 3002 may include a decoder 3005 and memory elements 3004A, 3004B, 3004C that may correspond to the memory elements 422A, 422B, 422C and decoder 420 of FIG. 4. The column correction controller may serially shift four correction signals to the memory elements 3008A, 3008B, 3008C, 3010A, 3010B, 3010C, 3012A, 3012B, 3012C, 3014A, 3014B, 3014C. Any four correction signals may be used loaded including, for example, four main correction signals corresponding to four point-cells from which a buffer may receive a signal. In some examples, the column correction controller 214 may load the auxiliary correction signal at one of the sets of memory elements.

Outputs (Q) of the memory elements 3008A, 3008B, 3008C, 3010A, 3010B, 3010C, 3012A, 3012B, 3012C, 3014A, 3014B, 3014C may be provided to a multiplexer 3006. An input to the multiplexer 3006 may receive a map select signal from the column correction controller 214 (labeled Map_Select in FIG. 30). Upon receiving a new configuration or map for the crosspoint switch 200 (e.g., as described at action 508 of the process flow 500), the column correction controller 214 may determine whether the requested configuration calls for a correction signal for the column buffer that is stored one of the sets of memory elements 3008A, 3008B, 3008C, 3010A, 3010B, 3010C, 3012A, 3012B, 3012C, 3014A, 3014B, 3014C. If yes, then the column correction controller 214 may cause the map select line to carry a signal corresponding to appropriate set of memory elements (e.g., memory elements 3008A, 3008B, 3008C, memory elements 3010A, 3010B, 3010C, memory elements 3012A, 3012B, 3012C, or memory elements 3014A, 3014B, 3014C. The multiplexer 3006 may cause the correction signal from the selected set of memory elements to appear at the inputs (D) of the memory elements 3004A, 3004B, 3004C. The column correction controller 214 may then cycle the write enable (indicated by wr) to load the selected correction signal to the decoder 3005. The decoder 3005 may provide the control signal bits a0, a1, b0, b1 corresponding to the selected correction signal to the buffer.

Figure 31:
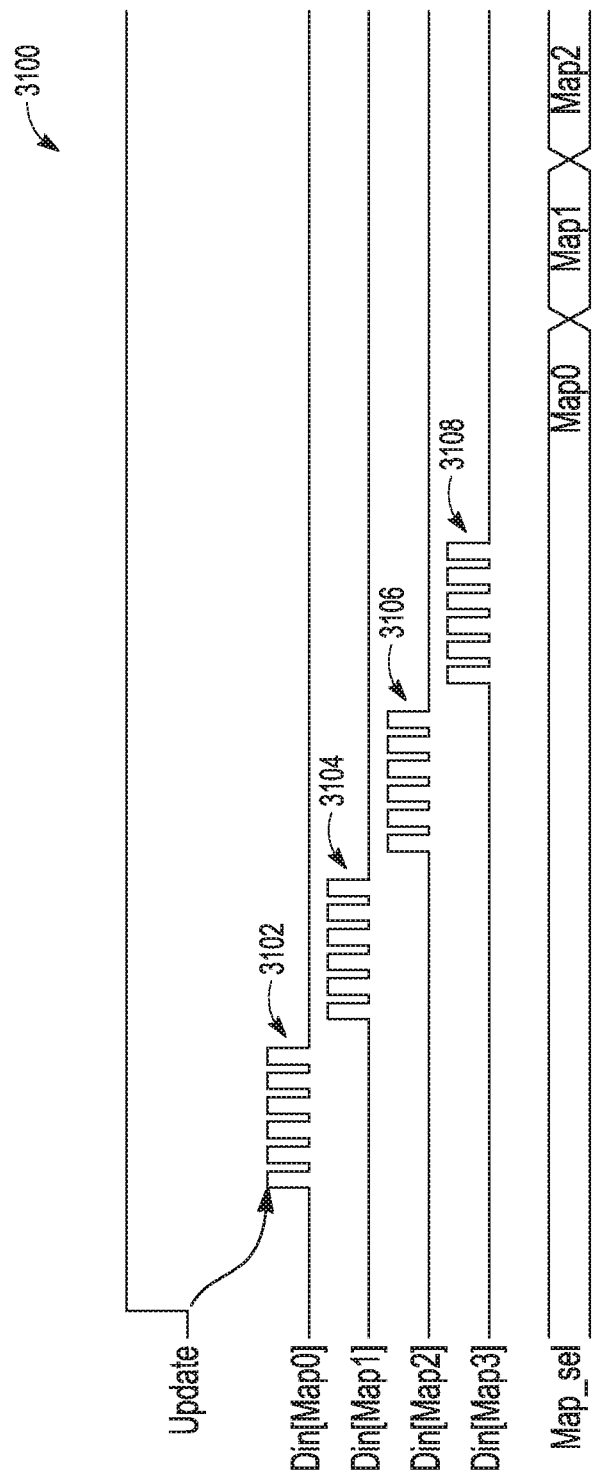
FIG. 31 shows one example of a timing diagram for loading the memory elements of the portion of the communication bus shown in FIG. 30.

FIG. 31 shows one example of a timing diagram for loading the memory elements 3008A, 3008B, 3008C, 3010A, 3010B, 3010C, 3012A, 3012B, 3012C, 3014A, 3014B, 3014C of the portion of the communication bus 3003 shown in FIG. 30. An update signal, which may be initiated, for example, by a user as shown in FIG. 5 and indicated by Update in FIG. 31, may initially go high, indicating that the memory elements are to be loaded. The update signal may go high, for example, when the crosspoint switch 200 is reset. FIG. 31 also shows signals 3102, 3104, 3106, 3108 being serially shifted on data lines Din[Map0], Din[Map1], Din[Map2], and Din[Map3], respectively. Map select line (indicated in FIG. 31 as Map_sel) may include two bits (e.g., on two separate lines) for selecting the appropriate correction signal at the multiplexer 3006.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A crosspoint switch, comprising:
    a first row buffer comprising: a first row buffer input; a first row buffer output; and a first row buffer correction input;
    a second row buffer comprising: a second row buffer input electrically coupled to the first row buffer output; a second row buffer output; and a second row buffer correction input;
    a first column buffer comprising: a first column buffer input; a first column buffer output; and a first column buffer correction input;
    a second column buffer comprising: a second column buffer input electrically coupled to the first column buffer output; a second column buffer output; and a second column buffer correction input;
    a first switch having an open position and a closed position, wherein when the first switch is in the closed position, the second row buffer output is electrically coupled to the first column buffer input;
    a correction controller configured to:
        send a first correction signal to the first row buffer;
        send a second correction signal to the second row buffer;
        receive an indication that the first switch is closed;
        after receiving the indication that the first switch is closed, send a third correction signal to the first column buffer; and
        after receiving the indication that the first switch is closed, send a fourth correction signal to the second column buffer.

2. The crosspoint switch of claim 1, wherein the correction controller is further configured to:
    send a first test signal to the first row buffer input;
    while providing the first test signal to the first row buffer input, send a first plurality of test correction signals to the first row buffer;
    select the first correction signal from the first plurality of test correction signals based at least in part on a first test output signal at the first row buffer output;
    send a second test signal to the first row buffer input;
    while providing the second test signal to the first row buffer input, send a second plurality of test correction signals to the second row buffer; and
    select the second correction signal from the second plurality of test correction signals based at least in part on a second test output signal at the second row buffer output.

3. The crosspoint switch of claim 2, further comprising a ring oscillator electrically coupled to the first row buffer input to generate the first test signal.

4. The crosspoint switch of claim 3, further comprising:
    a low pass filter electrically coupled to first row buffer output to generate a low-pass filtered output of the first row buffer;
    a comparator electrically coupled to receive the low-pass filtered output of the first row buffer, wherein an output of the comparator is logical one if the low-pass filtered output of the first row buffer is greater than a threshold value;
    a counter electrically coupled to receive the output of the comparator to sum the output of the comparator over a plurality of cycles of the comparator; and
    a DAC electrically coupled to receive an output of the counter, convert the output of the counter to an analog signal, and provide the analog signal at the first row buffer input.

5. The crosspoint switch of claim 2, wherein the correction controller is further configured to:
    close the first switch;
    send a third test signal to the first row buffer;
    while providing the third test signal to the first row buffer, send a third plurality of test correction signals to the first column buffer; and
    select the third correction signal from the third plurality of test correction signals based at least in part on a third test output signal at the first column buffer output while the third test signal is sent.

6. The crosspoint switch of claim 5, further comprising:
a third row buffer comprising: a third row buffer input, a third row buffer output; and a third row buffer correction input;
a second switch having an open position and a closed position, wherein when the second switch is in the closed position, the third row buffer output is electrically coupled to the first column buffer input; and
wherein the correction controller is also configured to:
close the second switch;
send a fourth test signal to the third row buffer;
while sending the fourth test signal to the third row buffer, send a fourth plurality of test correction signals to the first column buffer correction input; and
select a fifth correction signal for the first column buffer from the fourth plurality of test correction signals.

7. The crosspoint switch of claim 6, further comprising:
a first serial bus electrically coupling the correction controller to the first column buffer, wherein the first serial bus comprises a first data line; a second data line; and a map select line;
a first memory element on the first data line;
a second memory element on the second data line; and
a multiplexer on the map select line, wherein the multiplexer is electrically coupled to the first memory element and the second memory element, and wherein the correction controller is also configured to:
serially shift at least a portion of the third correction signal to the first memory element on the first data line;
serially shift at least a portion of the fifth correction signal to the second memory element on the second data line;
receive an indication that the first switch is to be closed; and
send to the multiplexer on the map selection line a first map selection signal instructing the multiplexer to connect the first memory element to the first column buffer.

8. The crosspoint switch of claim 1, further comprising a first row buffer digital-to-analog converter (DAC) electrically coupled between the correction controller and the first row buffer correction input, the first row buffer DAC to:
receive the first correction signal;
convert the first correction signal to a first analog correction signal; and
send the first analog correction signal to the first row buffer correction input.

9. The crosspoint switch of claim 1, wherein the first row buffer comprises:
a signal path comprising a positive side and a negative side; and
a correction unit comprising a supplemental positive side current source and a supplemental negative side current source, wherein the first correction signal enables at least one of the supplemental positive side current source or the supplemental negative side current source.

10. The crosspoint switch of claim 1, further comprising:
a third column buffer comprising a third column buffer input; a third column buffer output electrically coupled to the first column buffer input; and a third column buffer correction input, wherein the correction controller is further configured to:
send a sixth correction signal to the third column buffer;
send a third test signal to the third column buffer input;
while providing the third test signal to the third column buffer input, send a fourth plurality of test correction signals to the first column buffer; and select a seventh correction signal from the fourth plurality of test correction signals based at least in part on a fourth test output signal from the first column buffer while the third test signal is send.

11. A method for controlling a plurality of buffers, comprising:
sending a first correction signal to a first row buffer comprising a first row buffer output;
sending a second correction signal to a second row buffer comprising a second row buffer input electrically coupled to the first row buffer output;
receiving an indication that a first switch is to be closed, wherein the first switch has an open position and a closed position, and wherein when the first switch is in the closed position, a second row buffer output of the second row buffer is electrically coupled to a first column buffer input of a first column buffer;
after receiving the indication that the first switch is closed, sending a third correction signal to the first column buffer; and
after receiving the indication that the first switch is closed, sending a fourth correction signal to a second column buffer, wherein a first column buffer output of the first column buffer is electrically coupled to a second column buffer input of the second column buffer.

12. The method of claim 11, further comprising:
sending a first test signal to the first row buffer;
while providing the first test signal to the first row buffer, sending a first plurality of test correction signals to the first row buffer;
selecting the first correction signal from the first plurality of test correction signals based at least in part on a first test output signal at the first row buffer output;
sending a second test signal to the first row buffer;
while providing the second test signal to a first row buffer input of the first row buffer, sending a second plurality of test correction signals to the second row buffer; and
selecting the second correction signal from the second plurality of test correction signals based at least in part on a second test output signal at the second row buffer output.

13. The method of claim 12, further comprising:
closing the first switch;
sending a third test signal to the first row buffer;
while providing the third test signal to the first row buffer, sending a third plurality of test correction signals to the first column buffer; and
selecting the third correction signal from the third plurality of test correction signals based at least in part on a third test output signal at the first column buffer output while the third test signal is send.

14. The method of claim 12, further comprising:
closing a second switch having an open position and a closed position, wherein when the second switch is in the closed position, an output of a third row buffer is electrically coupled to the first column buffer;
sending a fourth test signal to the third row buffer;
while sending the fourth test signal to the third row buffer, sending a fourth plurality of test correction signals to the first column buffer; and
selecting a fifth correction signal for the first column buffer from the fourth plurality of test correction signals.

15. The method of claim 12, wherein the first row buffer comprises a positive side current source and a negative side current source, and wherein the first correction signal is to enable a parameter correction unit.

16. A crosspoint switch, comprising:
a plurality of row buffers comprising a first row buffer and a second row buffer;
a plurality of column buffers comprising a first column buffer and a second column buffer;
a plurality of switches comprising a first switch, wherein the first switch has a closed position in which the first switch electrically couples an output of the second row buffer to an input of the first column buffer;
means for sending a first correction signal to the first row buffer;
means for sending a second correction signal to the second row buffer;
means for sending a third correction signal to the first column buffer at least in part in response to a closing of the first switch; and
means for sending a fourth correction signal to the second column buffer at least in part in response to the closing of the first switch.

17. The crosspoint switch of claim 16, further comprising:
means for sending a first test signal to the first row buffer input;
means for sending a first plurality of test correction signals to the first row buffer while providing the first test signal to the first row buffer input;
means for selecting the first correction signal from the first plurality of test correction signals based at least in part on a first test output signal at the first row buffer output;
means for sending a second test signal to the first row buffer input;
means for sending a second plurality of test correction signals to the second row buffer while providing the second test signal to the first row buffer input; and
means for selecting the second correction signal from the second plurality of test correction signals based at least in part on a second test output signal at the second row buffer output.

18. The crosspoint switch of claim 17, further comprising:
means for closing the first switch;
means for sending a third test signal to the first row buffer;
means for sending a third plurality of test correction signals to the first column buffer while providing the third test signal to the first row buffer; and
means for selecting the third correction signal from the third plurality of test correction signals based at least in part on a third test output signal at the first column buffer output while the third test signal is sent.

19. The crosspoint switch of claim 16, further comprising:
a third row buffer, wherein a second switch of the plurality of switches has a closed position in which the second switch electrically couples an output of the third row buffer to the input of the first column buffer;
means for closing the second switch;
means for sending a fourth test signal to the third row buffer;
means for sending a fourth plurality of test correction signals to the first column buffer correction input while sending the fourth test signal to the third row buffer; and
means for selecting a fifth correction signal for the first column buffer from the fourth plurality of test correction signals.

20. The crosspoint switch of claim 16, further comprising:
means for receive the first correction signal;
means for converting the first correction signal to a first analog correction signal; and
means for sending the first analog correction signal to the first row buffer correction input.

21. The crosspoint switch of claim 16, wherein the first correction signal comprises at least one of a supplemental positive side current or a supplemental negative side current.

* * * * *